US005619579A

United States Patent [19]

Ando et al.

[11] Patent Number: 5,619,579

[45] Date of Patent: Apr. 8, 1997

[54] REVERBERATION IMPARTING APPARATUS

[75] Inventors: Shigeo Ando; Yuji Ikegaya; Shinichi Muramatsu, all of Hamamatsu, Japan

[73] Assignee: Yamaha Corporation, Japan

[21] Appl. No.: 364,615

[22] Filed: Dec. 27, 1994

[30] Foreign Application Priority Data

Dec. 29, 1993 [JP] Japan .................................... 5-352247

[51] Int. Cl.$^{6}$ ........................................................ H03G 3/00

[52] U.S. Cl. ................................................ 381/63; 84/630

[58] Field of Search .......................... 381/61–63; 84/630, 84/DIG. 26

[56] References Cited

U.S. PATENT DOCUMENTS

| | | | |
|---|---|---|---|
| 4,570,523 | 2/1986 | Futamase et al. | 381/63 |
| 4,706,291 | 11/1987 | Kakubo et al. | 381/63 |
| 5,040,220 | 8/1991 | Iwamatsu | 381/63 |
| 5,148,384 | 9/1992 | Ikegaya et al. . | |
| 5,163,018 | 11/1992 | Ikegaya et al. . | |

OTHER PUBLICATIONS

"A Sound Field Reproduction System For Use in Music Training Rooms", Aug. 28 -Sep. 1, 1992, by Shigeo Ando, pp. 171–174.

"Control of Frequency Characteristics of Reverberation With 4–channel FIR Filters", 1989, IEEE ASSP Workshop, by Shigeo Ando, Yoshikatsu Matsubara and Hiromi Sotome.

"Sound Field Control of a Small Room For Music Training and Its Study", Sep. 21, 1990, by Shigeo Ando, pp. 1–8, with a translated summary.

"Sound Field Control in Music Training Rooms (Part 2) -An Application of Directional Impulse Response Convolution Method–", Jan. 23, 1993 by Shigeo Ando, pp. 1–6, with a translated summary.

"Sound Field Synthesis Technique Using Impulse Response Convolution Method and Its Demonstration", Feb. 4–5, 1993, by Hiromi Sotome and Shigeo Ando, pp. 87–90, with a translated summary.

*Primary Examiner*—Curtis Kuntz
*Assistant Examiner*—Ping W. Lee
*Attorney, Agent, or Firm*—Graham & James LLP

[57] ABSTRACT

A reverberation imparting apparatus comprises at least a data shift register, a coefficient shift register and an arithmetic convolution unit. The data shift register stores a string of sampling data each representative of an instantaneous value of an audio signal at each sampling period, while the coefficient shift register stores a string of coefficients which are created on the basis of waveforms of reflected sounds in response to an impulse sound artificially produced in a certain sound-field space such as a church. Normally, the data shift register successively stores new sampling data which are newly inputted thereto so that the contents of the data shift register is successively renewed. The arithmetic convolution unit performs an arithmetic convolution, using the string of coefficients on the string of sampling data. However, when an amplitude level indicated by the sampling data becomes lower than a threshold level, the data shift register prohibits the new sampling data from being stored therein, so that the string of sampling data stored are fixed. In addition, the coefficients stored are successively shifted from relatively-old coefficients, which are produced responsive to relatively-old waveforms of reflected sounds, to relatively-new coefficients which are produced responsive to relatively-new waveforms of reflected sounds. Hence, the arithmetic convolution unit performs the arithmetic convolution, using the coefficients which are successively shifted, on the fixed string of sampling data. Thus, it is possible to impart a long-time reverberation to the audio signal.

2 Claims, 12 Drawing Sheets

FIG.1 (a)
REFLECTED SOUNDS
( IMPULSE RESPONSE )
FIG.1 (b)
AUDIO SIGNALS
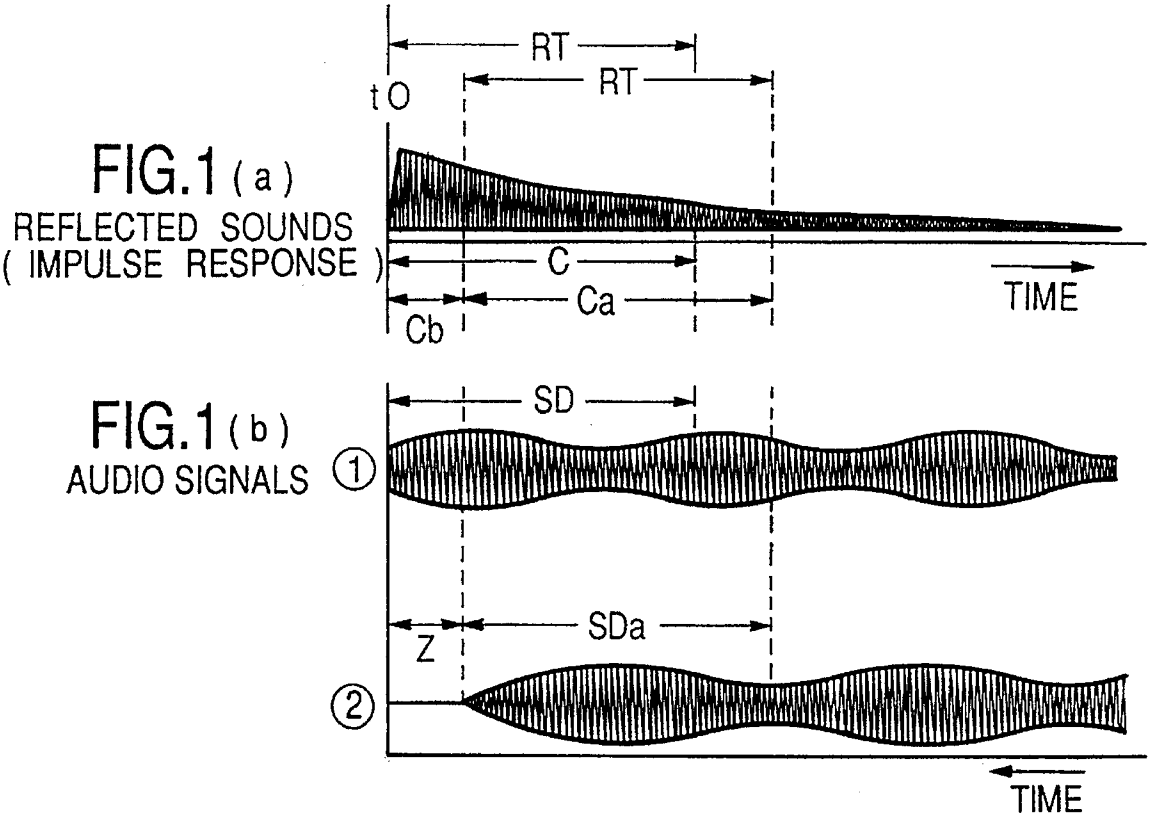
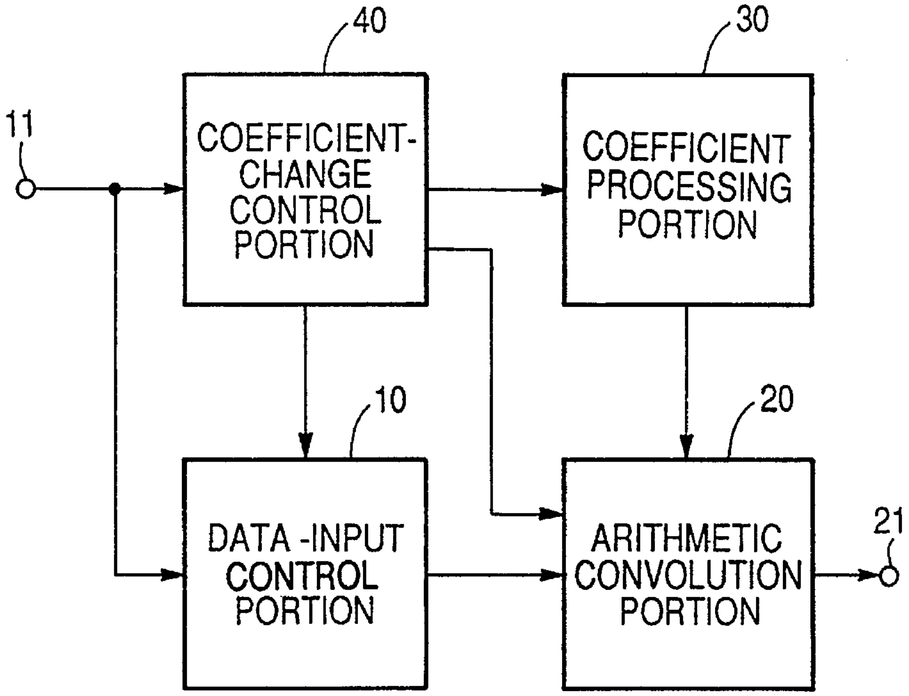
FIG.2

30: COEFFICIENT PROCESSING PORTION

REVERBERATION IMPARTING APPARATUS

BACKGROUND OF THE INVENTION

1. Field of the Invention

The present invention relates to a reverberation imparting apparatus which simulates acoustic characteristics of the sound-field space having a relatively long reverberation time.

2. Prior Art

As the method of imparting reverberation to audio signals, there is provided a reverberation imparting method which utilizes a so-called reflected-sound-synthesis system. This method uses a memory, such as a read-only memory (i.e., ROM), which stores a string of sampling data representative of reflected sounds in advance. The reflected sounds are picked up (i.e., an impulse response is measured) when an impulse sound is artificially produced in the certain sound-field space such as the concert hall or auditorium. Then, the arithmetic convolution is performed using a string of sampling data, which are stored in the ROM, on another string of sampling data representative of the audio signals. Thus, it is possible to obtain the audio signals to which the reverberation is imparted. This method is advantageous in that by merely storing a string of sampling data representative of the reflected sounds, a variety of reverberation effects, corresponding to a variety of sound-field spaces, can be imparted to the audio signals.

Meanwhile, when an impulse sound is produced in a certain kind of sound-field space such as the church, the reverberation sounds are sounded for a relatively long time. When synthesizing such reverberation sounds by the above-mentioned reverberation imparting method utilizing the reflected-sound-synthesis system, the arithmetic convolution should be performed, using a string of sampling data representative of the reverberation sounds having a relatively long reverberation time, on a string of sampling data representative of the audio signal which also have a relatively long sounding time. Such arithmetic convolution requires a high-performance digital signal processor (i.e., DSP) having a large tap number. In other words, it is necessary to provide a DSP which is capable of performing the arithmetic convolution, using the addition and multiplication, many times in each sampling period. In order to embody the DSP, having a large tap number, it is necessary to provide a plenty of multipliers inside of the DSP. Or, it is necessary to increase an execution speed of the DSP such that the convolution processing, using the addition and multiplication, can be performed many times in one sampling period. Because of the reasons described above, it is difficult for the conventional technology to impart the reverberation sounds, having a long reverberation time, to the audio signals.

SUMMARY OF THE INVENTION

It is an object of the present invention to provide a reverberation imparting apparatus which is capable of imparting the reverberation sounds, having a relatively long reverberation time, to the audio signals without providing a complex hardware configuration in the DSP.

According to the present invention, a reverberation imparting apparatus comprises at least a data shift register, a coefficient shift register and an arithmetic convolution unit. The data shift register stores a string of sampling data each representative of an instantaneous value of an audio signal at each sampling period, while the coefficient shift register stores a string of coefficients which are created on the basis of waveforms of reflected sounds in response to an impulse sound artificially produced in a certain sound-field space such as a church. Normally, the data shift register successively stores new sampling data which are newly inputted thereto so that the contents of the data shift register is successively renewed. The arithmetic convolution unit performs an arithmetic convolution, using the string of coefficients, read from the coefficient shift register, on the string of sampling data read from the data shift register.

When an amplitude level indicated by the sampling data becomes lower than a threshold level, in other words, when a long-time reverberation should be imparted to the audio signal, the data shift register prohibits the new sampling data from being stored therein, so that the string of sampling data stored are fixed. In addition, the coefficients, stored by the coefficient shift register, are successively shifted from relatively-old coefficients, which are produced responsive to relatively-old waveforms of reflected sounds, to relatively-new coefficients which are produced responsive to relatively-new waveforms of reflected sounds. Hence, the arithmetic convolution unit performs the arithmetic convolution, using the coefficients which are successively shifted, on the fixed string of sampling data. Thus, it is possible to impart a long-time reverberation to the audio signal by merely shifting the coefficients without increasing the number of operations required in the arithmetic convolution.

BRIEF DESCRIPTION OF THE DRAWINGS

Further objects and advantages of the present invention will be apparent from the following description, reference being had to the accompanying drawings wherein the preferred embodiments of the present invention are clearly shown.

In the drawings:

FIGS. 1(*a*) and 1(*b*) show graphs for reflected sounds and audio signals, respectively, which are used to explain the working principle of the present invention;

FIG. 2 is a block diagram showing a simplified configuration of a DSP which realizes a reverberation imparting apparatus according to a first embodiment of the present invention;

DESCRIPTION OF THE PREFERRED EMBODIMENTS

Figure 3:
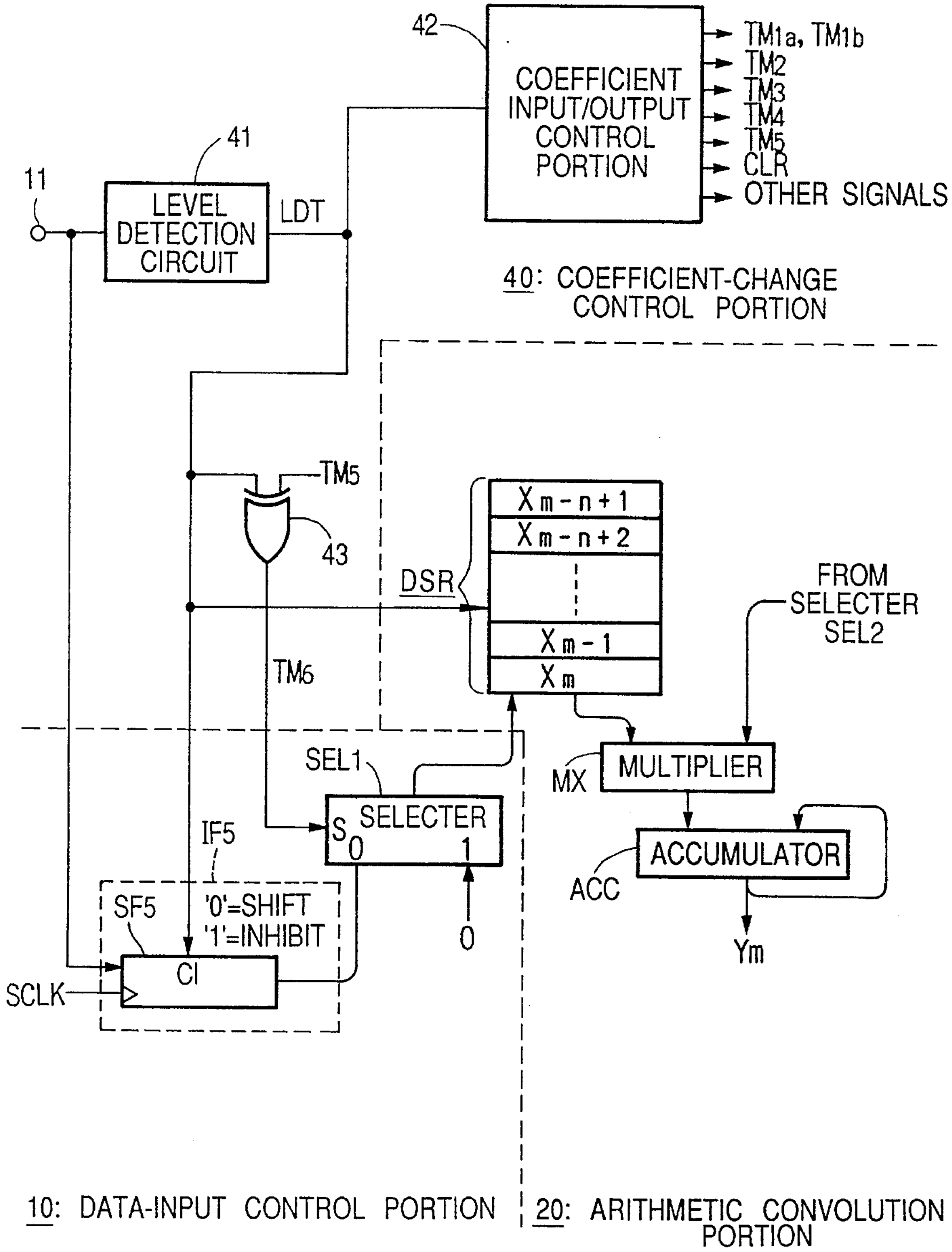
FIG. 3 is a block diagram showing a detailed configuration for a selected part of the DSP shown in FIG. 2.

[A] Working Principle of the Present Invention

Before specifically describing the embodiments of the present invention, the working principle of the present invention will be described with reference to FIGS. 1(*a*) and 1(*b*). The present invention offers a brand-new idea for the synthesis of the reverberation sounds having a long reverberation time (hereinafter, simply referred to as "long-time reverberation sounds").

In FIG. 1(*a*), a graph shows waveforms of reflected sounds (i.e., impulse response) which are produced when producing an impulse sound in the certain sound-field space. The waveforms progress from the left to the right in the graph in FIG. 1(*a*) along a time axis; and those waveforms are converted into a string of sampling data. In FIG. 1(*b*), each of graphs (b)-① and (b)-② shows waveforms representative of the audio signals to which the reverberation sounds should be imparted. Those waveforms, shown by each of the graphs (b)-① and (b)-②, are also converted into a string of sampling data. Different from the graph (a), each of the graphs (b)-① and (b)-② has a reverse time axis, by which waveforms reversely progress from the right to the left in each of those graphs. Hence, the sampling data corresponding to the waveform at the leftmost point in each of those graphs is the newest sampling data, while the sampling data corresponding to the waveform at the rightmost point is the oldest sampling data.

In the embodiments which will be described later, the manner of the arithmetic convolution is changed over responsive to the amplitude level of the waveform indicating the audio signal to which the reverberation sound should be imparted.

In the graph (b)-①, the amplitude level of the audio signal at the current timing is relatively high. In that case, the apparatus extracts a string of sampling data (see 'C' in the graph (a)), representative of the waveforms of the reflected sounds which are produced in a certain time 'RT' which is measured from a moment t0 at which the impulse sound is produced. In addition, the apparatus also extracts another string of sampling data (see 'SD' in the graph (b)-①) representative of the audio signals which are inputted thereto during the previous time RT until the current timing. Then, the apparatus performs the arithmetic convolution, using a string of sampling data representative of the reflected sounds extracted, on another string of sampling data representative of the audio signals extracted. In other words, a string of sampling data 'C' are convoluted into another string of sampling data 'SD'. Thus, it is possible to synthesize the audio signals to which the reverberation sounds are imparted. The above-mentioned processing is equivalent to that of the conventional reverberation-imparting method employing the conventional reflected-sound-synthesis system.

In contrast, in the graph (b)-②, the amplitude level of the audio signal at the current timing is roughly equal to zero. In that case, a certain string of sampling data 'SDa' are selected for the execution of the arithmetic convolution. The string of sampling data 'SDa' emerge during the time RT which has been previously passed until a moment at which the amplitude level of the audio signal becomes equal to zero. In the graph (b)-②, during a certain interval of time 'Z', the amplitude levels of the audio signals are roughly equal to zero. A string of sampling data 'Cb', representative of the reflected sounds in the graph (a), corresponds to the interval of time 'Z', while a string of sampling data 'Ca' indicate the reflected sounds which are produced during the time RTa (where RTa=RT) after the interval of time Z. Hence, the string of sampling data 'Ca' are used as a string of coefficients which are used to perform the arithmetic convolution on the aforementioned string of sampling data 'SDa' representative of the audio signals.

In the above-mentioned arithmetic convolution, the string of sampling data 'Ca' are actually convoluted into the string of sampling data 'SDa'. However, the results of this arithmetic convolution are roughly equivalent to the results of the arithmetic convolution which is performed, using a string of sampling data "Cb+Ca", on a string of sampling data "Z+SDa". Because, the results of the arithmetic convolution, which is performed using the sampling data Z on the sampling data Cb, are represented by minimum values which are negligible.

If the amplitude levels of the audio signals are continuously equal to zero, the arithmetic convolution continuously uses the string of sampling data SDa but the coefficients, represented by the sampling data of the reflected sounds, are successively shifted along the time axis of the graph (a). Thus, the arithmetic convolution is performed continuously on the string of sampling data SDa by using the sampling data, representative of the reflected sounds, which are successively shifted along the time axis, as long as the amplitude levels of the audio signals are roughly equal to zero.

If the working principle described above is employed, even the computing device, having a limited tap number by which the arithmetic convolution is performed with respect to the limited time RT, can impart the long-time reverberation sounds to the audio signals although the working principle requires a limited amount of the sampling data, representative of the reflected sounds, which are provided in advance.

Next, the embodiments of the present invention will be described in detail.

[B] First Embodiment

(1) Overall Configuration

FIG. 2 is a block diagram showing a main configuration of a reverberation imparting apparatus, according to the present invention, which is embodied by a DSP. Herein, the DSP shown in FIG. 2 is mainly configured by a data-input control portion 10, an arithmetic convolution portion 20, a coefficient processing portion 30 and a coefficient-change control portion 40. The data-input control portion 10 is provided to input the audio signals, to which the reverberation should be imparted, into the DSP. Herein, the data-input control portion 10 inputs multiple sampling data, representative of the audio signal, by each sampling period; in other words, the data-input control portion 10 inputs one word of sampling data every sampling period through an input terminal 11. The arithmetic convolution portion 20 is provided to impart the reverberation to the audio signals. In order to impart the reverberation to the audio signals, the arithmetic convolution portion 20 performs an arithmetic convolution, using a string of coefficients, on a certain number of sampling data which have been previously inputted by the data-input control portion 10. Then, results of the arithmetic convolution are outputted through an output terminal 21. The coefficient processing portion 30 is provided to supply a string of coefficients for the arithmetic convolution to the arithmetic convolution portion 20. The coefficient processing portion 30 contains a coefficient storage which stores the coefficients used for the arithmetic convolution. The details of the coefficient storage will be described later. Thus, a string of coefficients, stored by the coefficient storage, are automatically supplied to the arithmetic convolution portion 20 in each sampling period. The coefficient processing portion 30 also contains a long-time reverberation storage which stores multiple sampling data representative of the long-time reflection sounds. Incidentally, the details of the long-time reverberation storage will be described later. The coefficients, stored by the coefficient storage, are renewed responsive to the stored contents of the long-time reverberation storage. Moreover, the coefficient processing portion 30 is configured such that the coefficients, stored by the coefficient storage, are rewritten by other coefficients which are inputted thereto from an external device (not shown). Incidentally, the details in circuit configuration for changing the coefficients will be described later. The coefficient-change control portion 40 detects the amplitude levels of the sampling data which are inputted thereto through the input terminal 11. Based on the results of the detection, the coefficient-change control portion 40 sends a variety of control signals to the coefficient processing portion 30 in order to change the coefficients used for the arithmetic convolution. In addition, the coefficient-change control portion 40 sends another control signal to the data-input control portion 10 in order to control the entry of the sampling data.

Next, the detailed circuit configuration will be described with respect to the data-input control portion 10, the arithmetic convolution portion 20 and the coefficient-change control portion 40 respectively with reference to FIG. 3.

(2) Data-Input Control Portion 10

The data-input control portion 10 is configured by an interface circuit IF5 and a selector SEL1. In the DSP according to the present embodiment, the data transfer is performed by the unit of one word. However, input data from the external device, e.g., the sampling data on which the arithmetic convolution should be performed, are inputted to the DSP in a serial manner, so that bits of the data are serially inputted to the DSP. Similarly, output data, e.g., data representative of the results of the arithmetic convolution, are outputted from the DSP in a serial manner, so that bits of the data are serially outputted from the DSP. Therefore, the data transmission is performed between the external device and DSP by means of the interface circuit providing a serial-to-parallel converting function or a parallel-to-serial converting function. So, the interface circuit IF5 in the data-input control portion 10 is provided to accomplish the above-mentioned data transmission between the DSP and external device. The interface circuit IF5 contains a shift register SF5 in order to perform the serial-to-parallel conversion. Now, bits of the sampling data (or serial data) representative of the audio signal to which the reverberation should be imparted are serially supplied to the interface circuit IF5 through the input terminal 11, wherein those bits are sequentially written into the shift register SF5 in synchronism with shift clocks SCLK. When the shift register SF5 accumulates one word of sampling data, the sampling data accumulated is outputted as parallel data. The shift register SF5 has a shift-clock-inhibit function by which the writing operation of the sampling data to the shift register SF5 is terminated. This shift-clock-inhibit function is made valid when a level-detection signal LDT is outputted, wherein the details of the level-detection signal LDT will be described later. The selector SEL1 has two input terminals, wherein a 0-input terminal receives output data of the shift register SF5 and a 1-input terminal receives fixed data '0', while a select terminal S receives a control signal $TM_6$, which will be described later. The selector SEL1 continuously selects the output data of the shift register SF5 as long as the control signal $TM_6$ is at '0'. On the other hand, when the control signal $TM_6$ is at '1', the selector SEL1 selects the fixed data '0'. Thus, the data selected is outputted from the selector SEL1.

(3) Arithmetic Convolution Portion

The arithmetic convolution portion 20 is configured by a data shift register DSR, a multiplier MX and an accumulator ACC. The data shift register DSR stores a string of sampling data which are inputted thereto through the data-input control portion 10. The data shift register DSR has multiple storage areas, the number of which is represented by a numerical symbol 'n'. The manner of inputting the sampling data to the data shift register DSR depends upon the amplitude level of the audio signal supplied to the input terminal 11. When the amplitude level of the audio signal at the input terminal 11 is relatively high, the sampling data are sequentially inputted to the data shift register DSR; hence, every time new sampling data is inputted, the sampling data, which have been already written in the data shift register DSR are shifted by one storage area. In contrast, when the amplitude level of the audio signal is relatively low, the sampling data are prohibited from being inputted to data shift register DSR; hence, no shift operation is performed in the data shift register DSR. As described above, certain control is performed responsive to the amplitude level of the audio signal with respect to the inputting manner of the sampling data by the data shift register DSR on the basis of the aforementioned level-detection signal LDT.

FIG. 3 shows that the data shift register DSR stores 'n' sampling data "$X_m$" to "$X_{m-n+1}$" at a certain sampling period. The 'n' sampling data $X_m$ to $X_{m-n+1}$ are respectively multiplied by coefficients, which are supplied from the coefficient processing portion 30, in the multiplier MX; and then, results of the multiplication are accumulated by the accumulator ACC. As described above, the arithmetic convolution is performed in a time-division manner on the sampling data $X_m$ to $X_{m-n+1}$. Thereafter, the accumulator ACC outputs an overall result of the arithmetic convolution "$Y_m$". When the arithmetic convolution is completed with respect to the current sampling period, the accumulator ACC is cleared to prepare for the next arithmetic convolution to be performed with respect to the next sampling period.

The DSP as shown by FIGS. 2 and 3 is design to output the result of arithmetic convolution $Y_m$ as well as the sampling data $X_{m-n+1}$ which is stored in the last storage area of the data shift register DSR by means of output means (not shown). In addition, the DSP can provide an adder (not shown) which adds input information from the external device to the result of arithmetic convolution $Y_m$ and then outputs the result of addition. Therefore, by interconnecting multiple DSPs, according to the present embodiment, in a cascade-connection manner, it is possible to form a computing device which is capable of performing a high-order arithmetic convolution. In that case, the information stored at the last storage area of the data shift register in a first DSP is supplied to the first storage area of the data shift register provided in a second DSP; and first result of arithmetic convolution produced by the first DSP is supplied to the second DSP in which it is added with second result of arithmetic convolution.

(4) Coefficient-Change Control Portion 40

The coefficient-change control portion 40 is configured by a level detection circuit 41, a coefficient input/output control portion 42 and an exclusive OR circuit 43. The level detection circuit 41 detects the amplitude of the audio signal represented by the sampling data applied to the input terminal 11. When the amplitude level detected is lower than a predetermined level, which is set in proximity to the zero level, the level detection circuit 41 outputs the aforementioned level-detection signal LDT whose level is set at '1'. As the control signals for changing the coefficients used for the arithmetic convolution, the coefficient input/output control portion 42 outputs control signals $TM_{1a}$, $TM_{1b}$ and $TM_2$ to $TM_5$ as well as a clear signal CLR and other signals which are not specifically described. Those signals are supplied to the coefficient processing portion 30. Incidentally, the coefficient processing portion 30 provides a coefficient shift register which stores a string of coefficients used for the arithmetic convolution; and the coefficients are changed inside of the coefficient processing portion 30. The coefficient processing portion 30 employs three kinds of coefficient-change processing, wherein first and second DSPs are connected together in the cascade-connection manner.

(a) First Coefficient-Change Processing

The coefficients, stored by the coefficient shift register provided in the second DSP, are shifted so that a certain storage area of the coefficient shift register becomes vacant. Then, the second DSP receives one coefficient within a string of coefficients which are stored by the coefficient shift register provided in the first DSP, so that the vacant storage area thereof is filled with that coefficient.

(b) Second Coefficient-Change Processing

The coefficients, stored by the first DSP, are shifted so that a certain storage area of the coefficient shift register becomes vacant. Then, the first DSP receives one coefficient within a string of coefficients which are stored by the second DSP, so that the vacant storage area thereof is filled with that coefficient.

(c) Third Coefficient-Change Processing

By referring to the aforementioned long-time reverberation storage, provided in the coefficient processing portion 30, the coefficients, used for the arithmetic convolution, are changed by those corresponding to the reflected sounds which emerge later along the time axis (see the graph (a) in FIG. 1). In other words, the coefficients are successively shifted from the coefficients, corresponding to the reflected sounds which are picked up at a first time after the moment at which the impulse sound is produced, to the other coefficients corresponding to the reflected sounds which are picked up at a second time which is later than the first time.

Each of the first and second coefficient-change processings is designated by an instruction given from the external device. Therefore, the coefficient input/output control portion 42 outputs a set of control signals ($TM_{1a}$, etc.) which meet the requirements of the coefficient-change processing designated. On the other hand, the third coefficient-change processing is automatically designated when the level detection circuit 41 outputs the level-detection signal LDT. Therefore, the coefficient input/output control portion 42 outputs a set of control signals, which meet the requirements of the third coefficient-change processing, in response to the level-detection signal LDT.

(5) Coefficient Processing Portion 30

Figure 4:
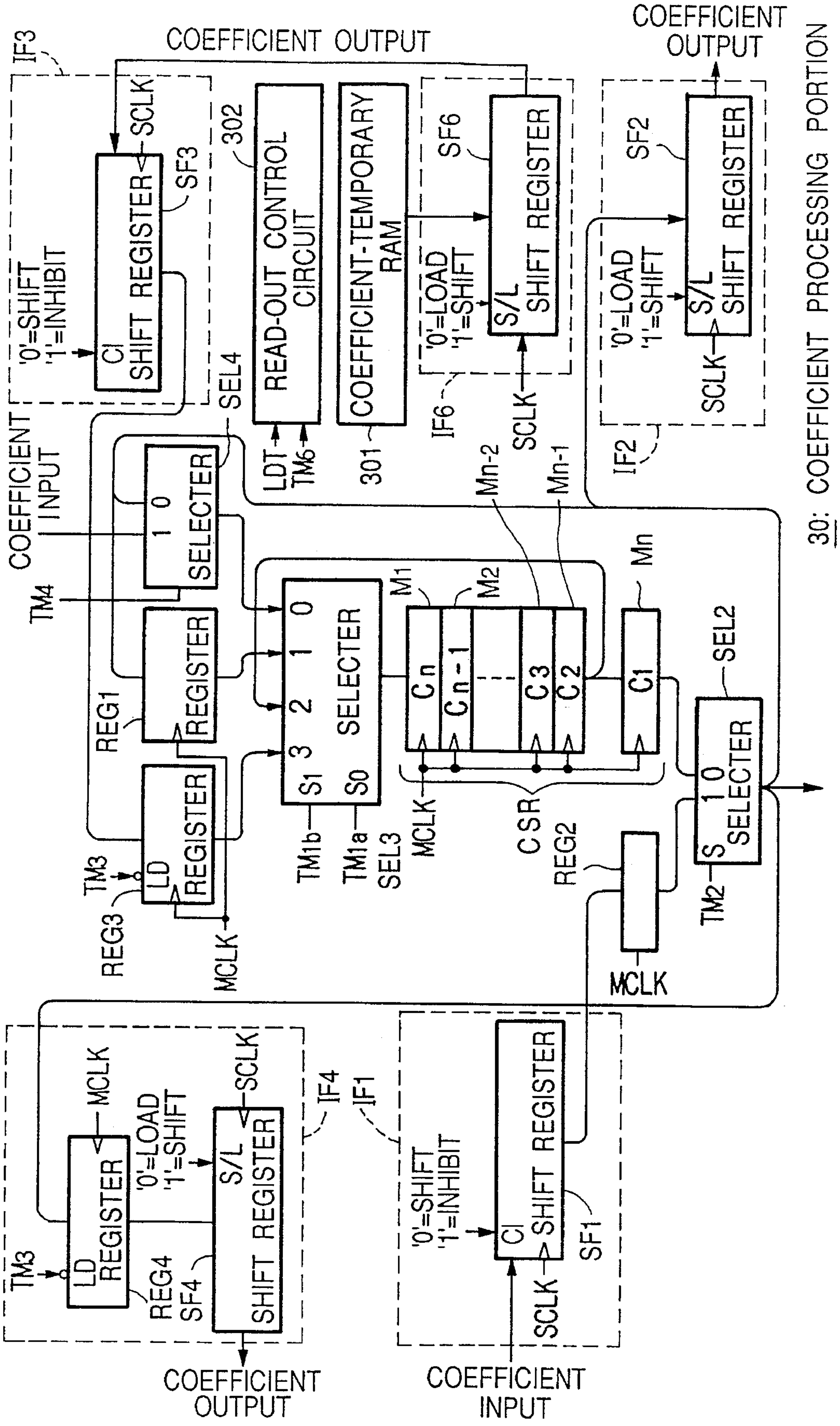
FIG. 4 is a block diagram showing a detailed configuration of a coefficient processing portion.

Next, the detailed configuration of the coefficient processing portion 30 will be described with reference to FIG. 4. The coefficient processing portion 30 provides a coefficient shift register CSR which is configured by connecting 'n' registers $M_1$ to $M_n$ together in a cascade-connection manner. Each of those registers $M_1$ to $M_n$ stores each of the coefficients to be supplied to the arithmetic convolution portion 20. In short, the coefficient shift register CSR is provided to play a role as the storage means to store a string of coefficients for the arithmetic convolution. FIG. 4 shows that a string of coefficients $C_1$ to $C_n$ for the arithmetic convolution are respectively stored by the registers $M_n$ to $M_1$. Master clocks MCLK are supplied to the coefficient shift register CSR as its shift clocks. The multiplication processing, performed by the multiplier MX provided in the aforementioned arithmetic convolution portion 20 (see FIG. 3), is performed in synchronism with the master clocks MCLK as well.

The first register $M_1$ of the coefficient shift register CSR receives an output of an selector SEL3, while an output of the last register $M_n$ is supplied to a 0-input terminal of a selector SEL2. The aforementioned control signal $TM_2$ is supplied to a select terminal 'S' of the selector SE12 as select information. The level of the control signal $TM_2$ is changed over by the coefficient input/output control portion 42 when the external device issues an instruction to change the coefficient to the DSP, or when the level-detection signal LDT is outputted.

An interface circuit IF1 is provided to input the coefficients given from the external device. As similar to the interface circuit IF5 described before, the interface circuit IF1 contains a shift register SF1 in order to perform the serial-to-parallel conversion. The shift register SF1 receives the shift clocks SCLK which synchronize with the master clocks MCLK. The level of the signal applied to a clock-inhibit terminal 'CI' of the shift register SF1 is changed over by the coefficient input/output control portion 42. When the level of the signal applied to the clock-inhibit terminal CI is at '0' level, the shift operation is permitted. On the other hand, when it is at '1' level, the shift operation is inhibited. Bits of coefficient data, given from the external device, are serially supplied to the interface circuit IF1. Those bits are sequentially written into the shift register SF1 in synchronism with the shift clocks SCLK. When the shift register SF1 completes the accumulation of one word of coefficient data, that parallel data is outputted as parallel data.

The coefficient data, given from the external device, is inputted to a register REG2 through the interface circuit IF1. This coefficient data is written into the register REG2 in synchronism with the master clock MCLK. The output of the register REG2 is supplied to a 1-input terminal of the selector SEL2. The selector SEL2 selects the output of the register $M_n$ when the control signal $TM_2$ is at '0' level, while the selector SEL2 selects the output of the register REG2 when the control signal $TM_2$ is at '1' level. The output of the selector SEL2 is outputted to the aforementioned multiplier MX of the arithmetic convolution portion 20. In addition, the output of the selector SEL 2 is also supplied to a register REG1 as well as a 0-input terminal of a selector SEL4. Further, this output is supplied to interface circuits IF2 and IF4 as well.

The interface circuit IF2 is provided to output the coefficient data, which is outputted from the selector SEL2, to the external device. This interface circuit IF2 contains a shift register SF2 in order to perform the parallel-to-serial conversion. In order to receive a signal, by which the operational state is changed over between a shift-operation state and a load-operation state, the shift register SF2 has a shift/load terminal 'S/L'. When a signal '0' is applied to the shift/load terminal S/L, the coefficient data (having a parallel-data form) outputted from the selector SEL2 is written into the shift register SF2. When a signal '1' is applied to the shift/load terminal S/L, bits of the coefficient data, written in the shift register SF2, are respectively shifted in synchronism with the shift clocks SCLK; hence, every time one shift clock is supplied, one bit in the coefficient data is shifted out toward the external device.

As similar to the interface circuit IF2, the interface circuit IF4 is provided to output the coefficient data, outputted from the selector SEL2, to the external device. The interface circuit IF4 contains a shift register SF4 and a register REG4. As similar to the shift register SF2 described above, the shift register SF4 is provided to perform the parallel-to-serial conversion. The register REG4 is provided to retain the coefficient data outputted from the selector SEL2. The register REG4 has a load terminal 'LD', to which the control signal $TM_3$, outputted by the coefficient input/output control portion 42, is supplied. When the control signal $TM_3$ is set at '0' level, the coefficient data, outputted from the selector SEL2, is written into the register REG4 by the master clock MCLK. The coefficient data, written in the register REG4, is loaded to the shift register SF4 when a signal '0' is applied to a shift/load terminal S/L. On the other hand, when a signal '1' is applied to the shift/load terminal S/L, bits of the coefficient data, written in the shift register SF4, are serially outputted to the external device in synchronism with the shift clocks SCLK.

As similar to the aforementioned interface circuit IF1, the operations of the interface circuits IF2 and IF4 described above are controlled by the control signals outputted from the coefficient input/output control portion 42.

As similar to the interface circuit IF1, an interface circuit IF3 contains a shift register SF3 in order to convert the serial data into the parallel data. The interface circuit IF3 plays a role to receive the coefficient data, given from the external device, for the arithmetic convolution to be performed. Moreover, the interface circuit IF3 plays another role to receive the coefficient data, for the arithmetic convolution, which are read from a coefficient-temporary RAM 301. Incidentally, the details of the coefficient-temporary RAM 301 will be described later. FIG. 4 shows merely one part in configuration of the interface circuit IF3, which is provided to receive the coefficient data read out from the coefficient-temporary RAM 301. However, FIG. 4 does not show another part which is provided to receive the coefficient data from the external device.

The coefficient-temporary RAM 301 is provided as the aforementioned long-time reverberation storage. Under the control of the external CPU or the like, the sampling data representative of the reflected sounds, having a long reverberation time, which are picked up on the certain sound-field space such as the church, are stored in the coefficient-temporary RAM 301 as the coefficients used for the arithmetic convolution. A read-out control circuit 302 is coupled to the coefficient-temporary RAM 301, so that the coefficient data are read out from the coefficient-temporary RAM 301 in response to the level-detection signal LDT and the control signal $TM_6$ given from the coefficient input/output control portion 42.

An interface circuit IF6 contains a shift register SF6 in order to perform the parallel-to-serial conversion. When a signal '0' is applied to a shift/load terminal S/L, the shift register SF6 inputs the coefficient data (having a parallel-data form) from the coefficient-temporary RAM 301. When a signal '1' is applied to the shift/load terminal S/L, bits of the coefficient data, written in the shift register SF6, are serially outputted from the interface circuit IF6. The coefficient data (having a serial-data form) outputted from the shift register SF6 is supplied to the interface circuit IF3, in which the serial coefficient data is converted into parallel coefficient data, which is then outputted to a register REG3.

The selector SEL3 has four input terminals, i.e., 0-input terminal to 3-input terminal. Herein, 0-input terminal receives an output of the selector SEL4; 1-input terminal receives an output of the register REG1; 2-input terminal receives an output of a (n−1)-th register $M_{n-1}$; and 3-input terminal receives an output of the register REG3. Further, the selector SEL3 has two select terminals 'S0' and 'S1'. The control signals $TM_{1a}$ and $TM_{1b}$, outputted from the coefficient input/output control portion 42, are respectively supplied to the select terminals S0 and S1. In the selector SEL3, the 0-input terminal is selected when both of the control signals $TM_{1a}$ and $TM_{1b}$ are at '0' level; the 1-input terminal is selected when $TM_{1a}$ is at '1' and $TM_{1b}$ is at '0'; the 2-input terminal is selected when $TM_{1a}$ is at '0' and $TM_{1b}$ is at '1'; and the 3-input terminal is selected when $TM_{1a}$ and $TM_{1b}$ are both at '1' level.

The master clocks MCLK are supplied to a clock terminal of the register REG3, while the control signal $TM_3$, outputted from the coefficient input/output control portion 42, is supplied to a load terminal 'LD' of the register REG3. When the control signal $TM_3$ is set at '0', output data of the shift register SF3 is written into the register REG3 in synchronism with the master clock MCLK. The selector SEL4 receives the output data of the selector SEL2 and the coefficient data given from the external device. Either the output data or coefficient data is selected by the selector SEL4 in response to the control signal $TM_4$ which is outputted from the coefficient input/output control portion 42 and is supplied to a select terminal 'S' of the selector SEL4. The data, selected by the selector SEL3, is written into the first register $M_1$ of the coefficient shift register CSR in synchronism with the master clock MCLK. That data is shifted to the next registers $M_2$, $M_3$, . . . in turn in synchronism with the master clocks MCLK.

[C] Operations of the DSP

Figure 5:
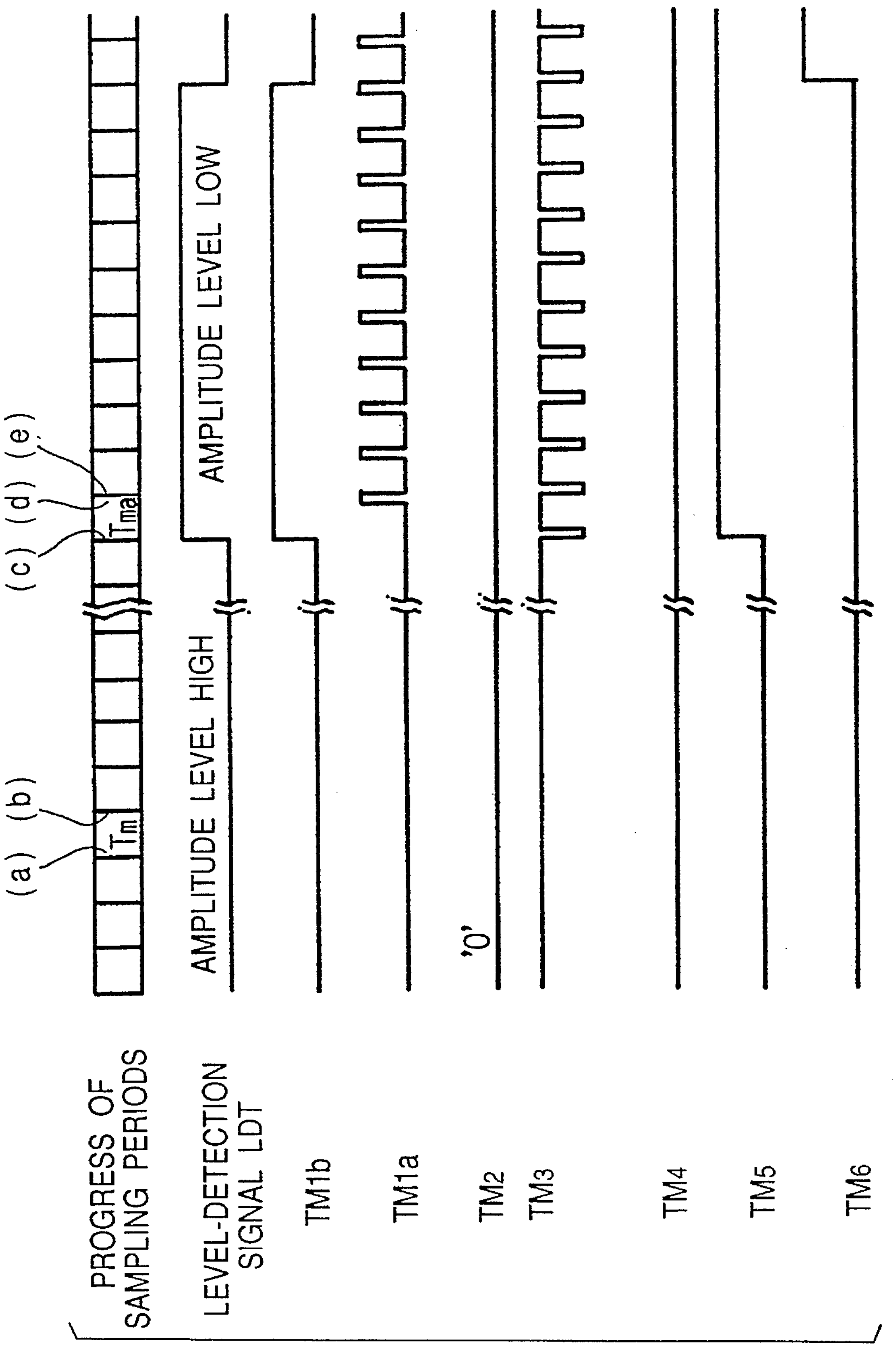
FIG. 5 is a time chart for a variety of signals, used by the first embodiment, in connection with a progress of sampling periods.
Figure 6:
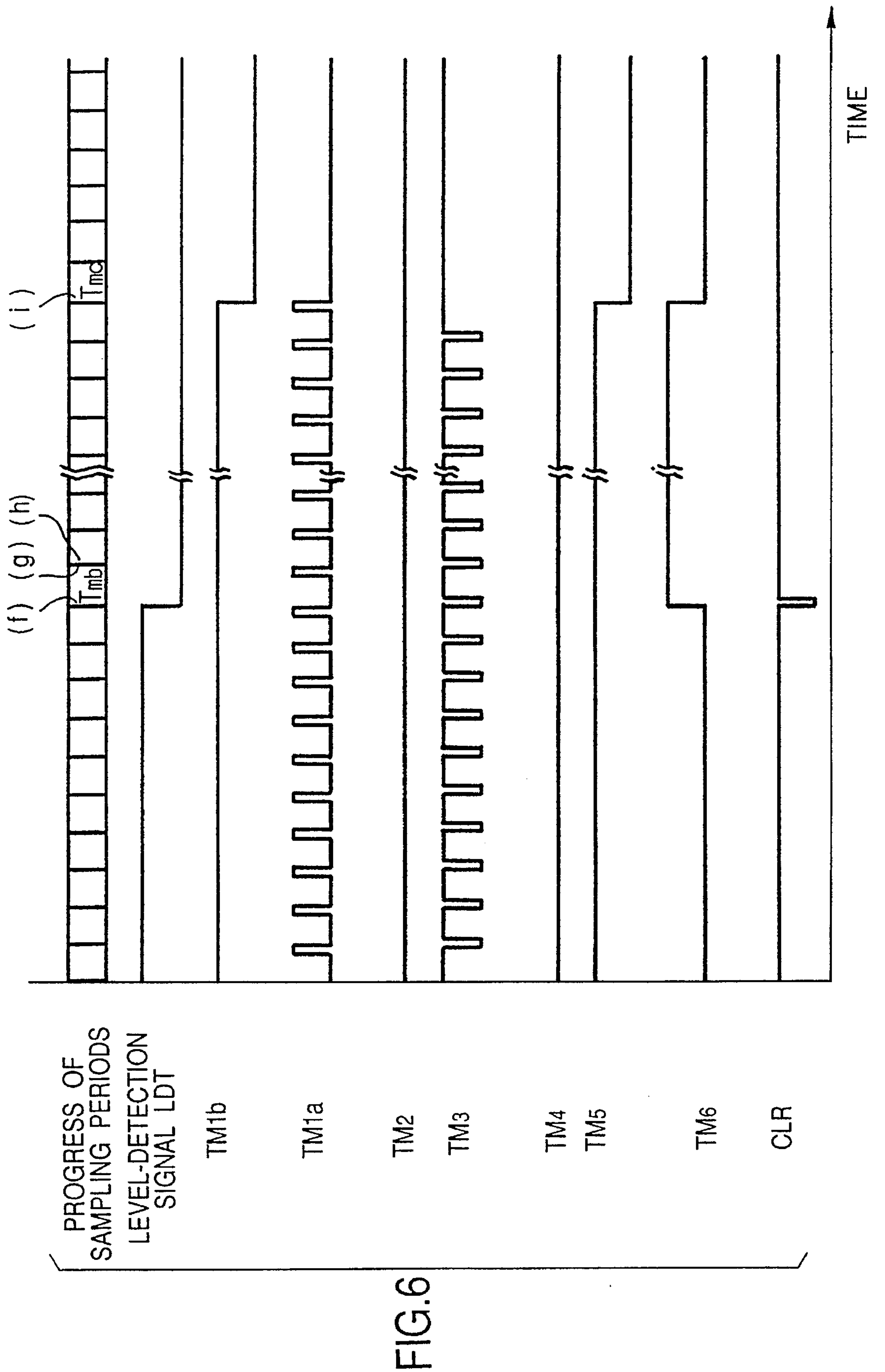
FIG. 6 is a time chart for a variety of signals used by the first embodiment.

Next, the operations of the DSP described heretofore will be described in detail. FIGS. 5 and 6 are time charts showing a variety of signals used by the DSP. Symbols (a) to (e), shown in FIG. 5, and symbols (f) to (i), shown in FIG. 6, respectively correspond to the specific states in interior configuration of the DSP (see FIGS. 7 to 15). Each of those drawings show interconnection manner among the registers, memories and the like which are configured inside of the DSP. Incidentally, each drawing omits the illustration of the selector SEL4.

Now, the operations of the DSP will be described in detail with reference to those drawings and with respect to each of four situations.

(1) First Situation

In the first situation where the amplitude level of the audio signal inputted is relatively high, the level-detection signal LDT is at '0' level. Hence, as shown in FIG. 5, all of the control signals $TM_{1a}$, $TM_{1b}$, $TM_2$, $TM_4$, $TM_5$ and $TM_6$ are set at '0' level, while the control signal $TM_3$ is set at '1' level. Thus, the coefficient data of the register $M_n$ is selectively outputted by the selector SEL2; and then, that data is selectively outputted by the selector SEL4; thereafter, that data is selectively outputted by the selector SEL3 and is supplied to the register $M_1$. The above-mentioned transmission of the coefficient data indicates that the circulation-type shift register is configured by the coefficient shift register CSR and the selectors SEL2, SEL4 and SEL3. This transmission will be described in detail below.

Figure 7:
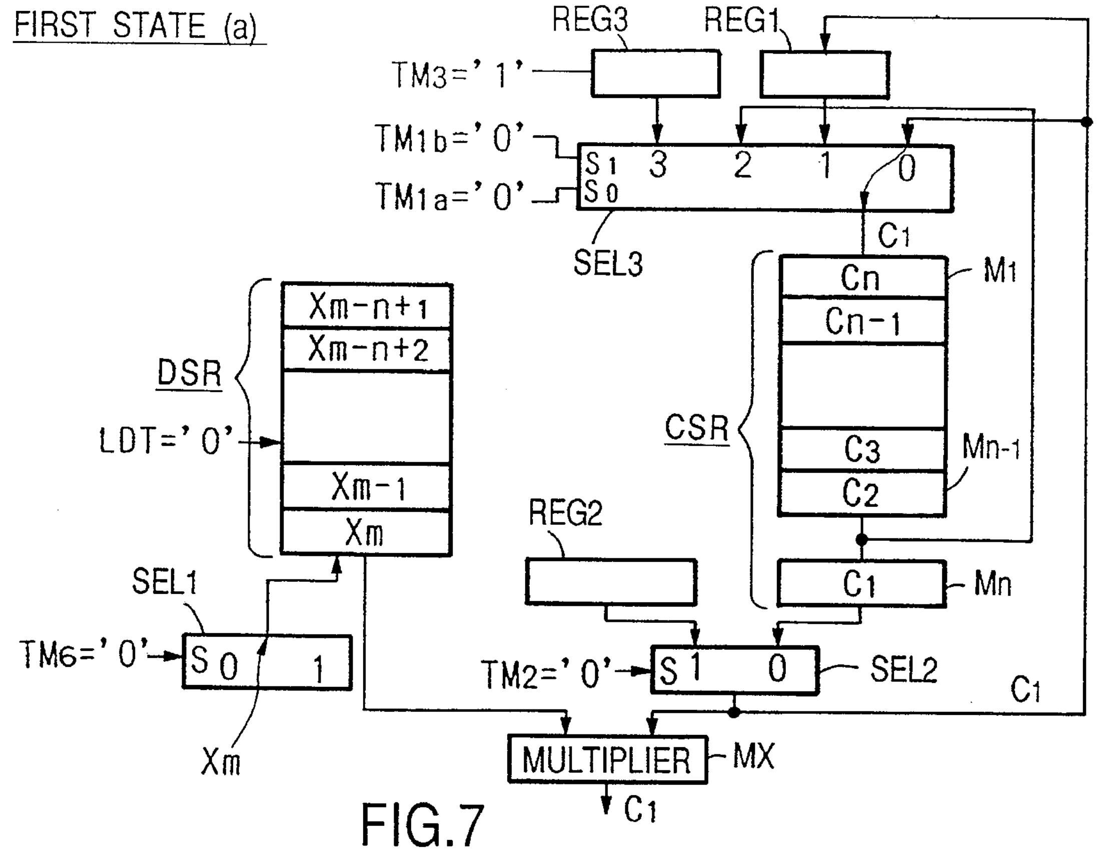
FIG. 7 is a block diagram showing a main part of the DSP in connection with a first state (a)
Figure 8:
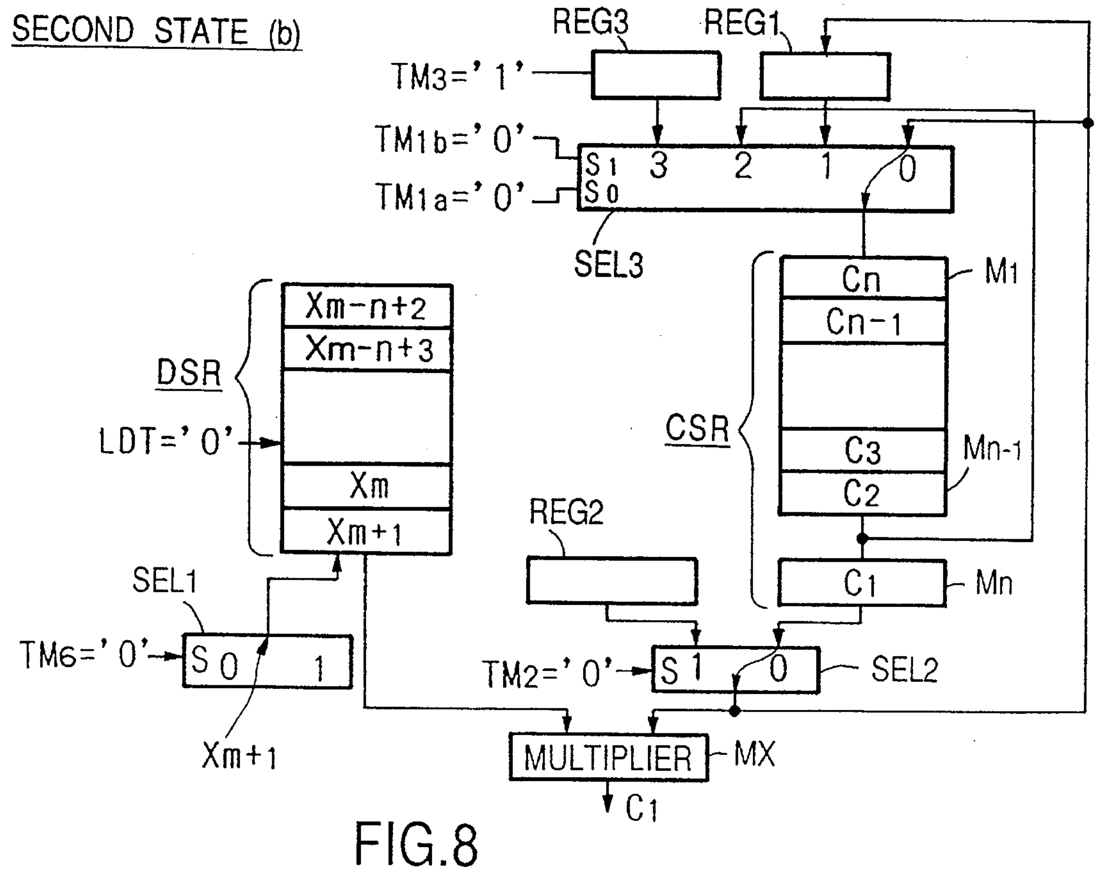
FIG. 8 is a block diagram showing a main part of the DSP in connection with a second state (b)
Figure 9:
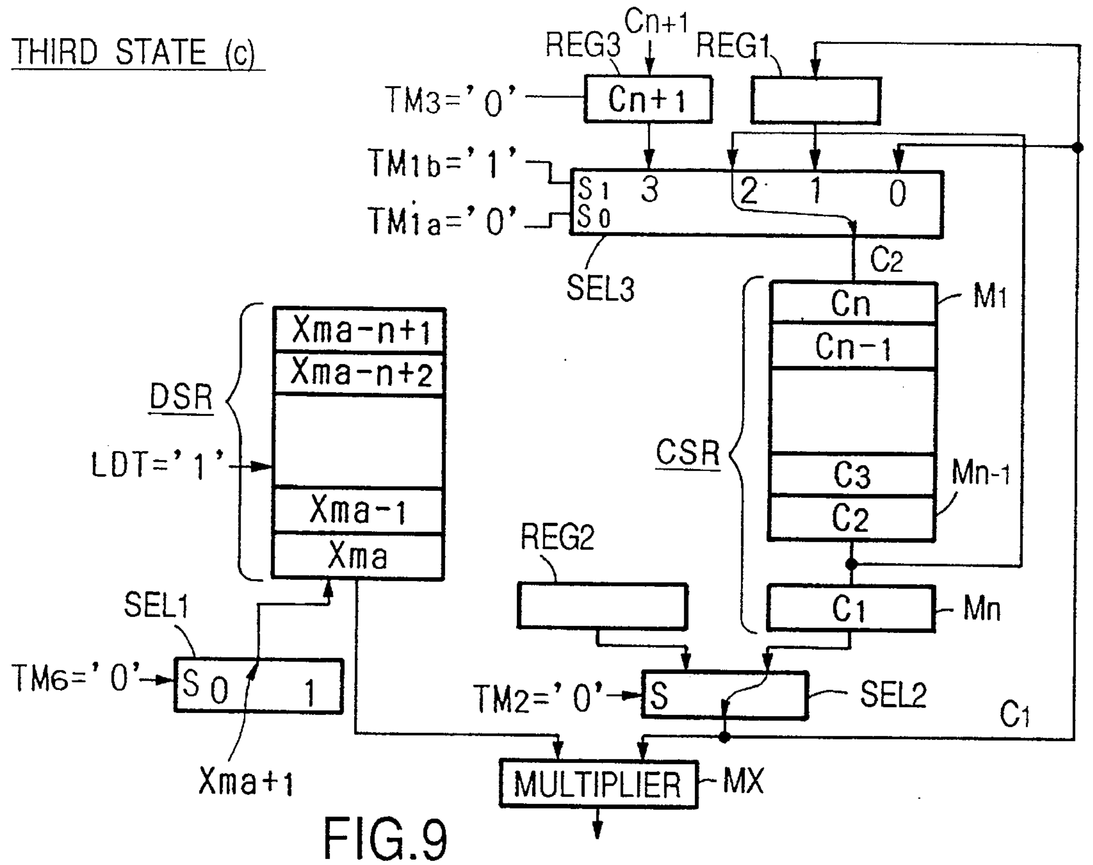
FIG. 9 is a block diagram showing a main part of the DSP in connection with a third state (c)
Figure 10:
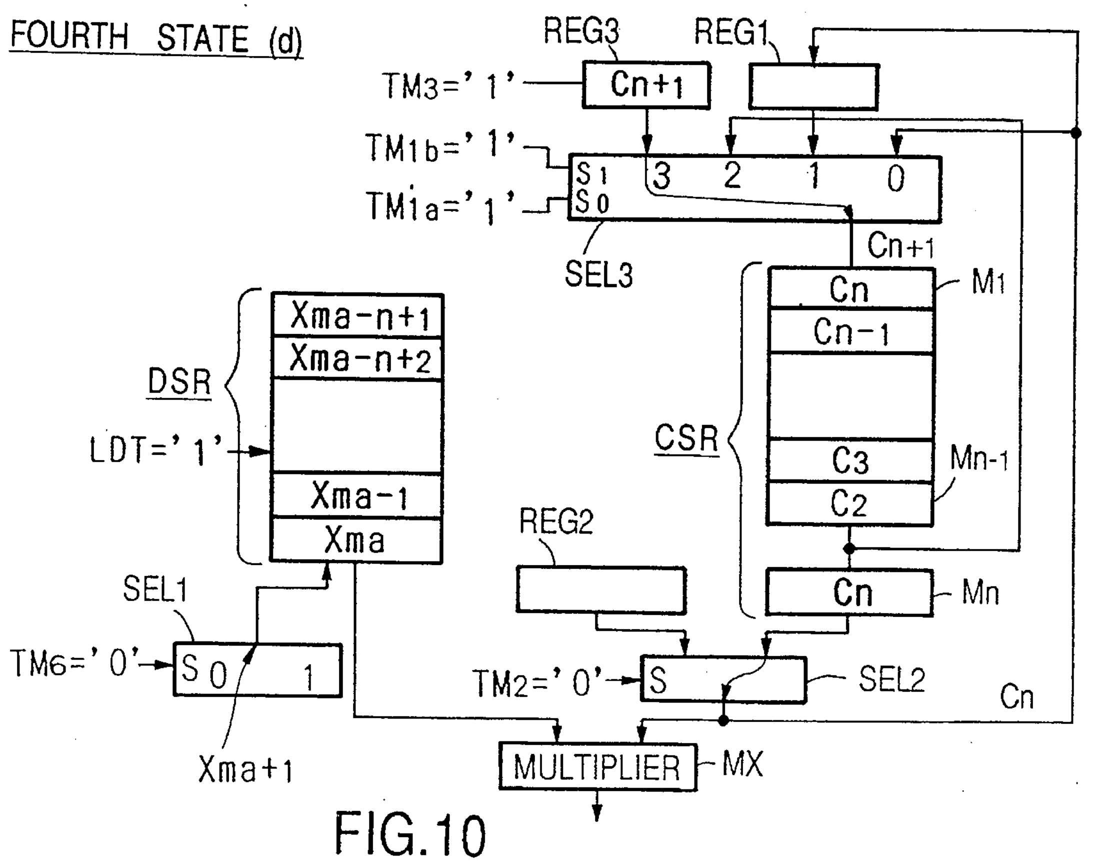
FIG. 10 is a block diagram showing a main part of the DSP in connection with a fourth state (d)
Figure 11:
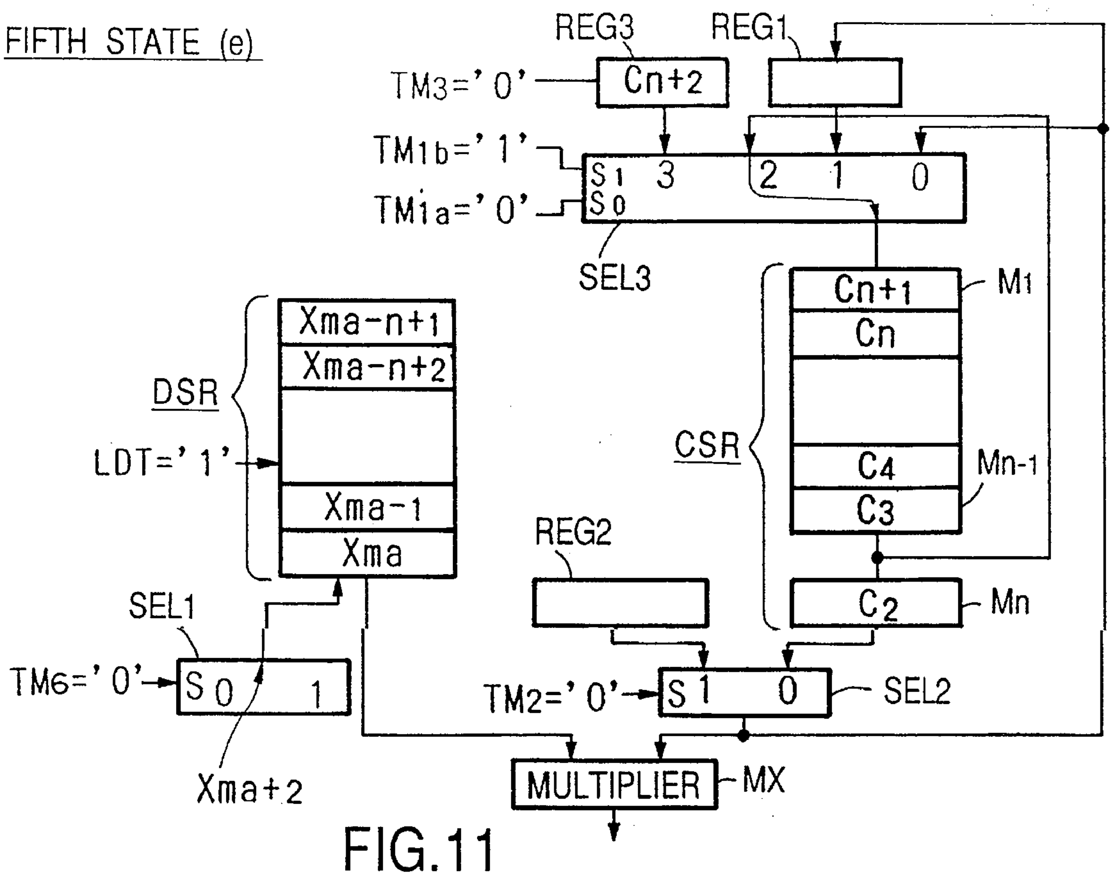
FIG. 11 is a block diagram showing a main part of the DSP in connection with a fifth state (e)
Figure 12:
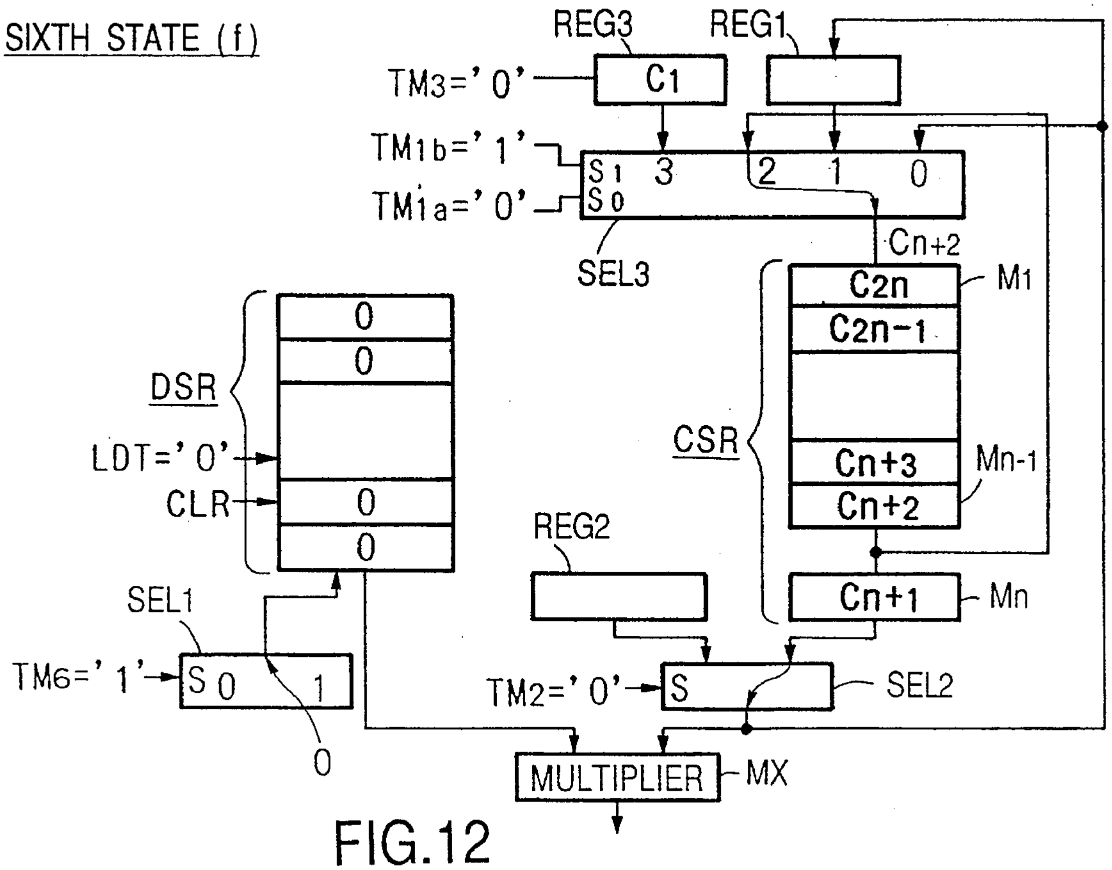
FIG. 12 is a block diagram showing a main part of the DSP in connection with a sixth state (f)
Figure 13:
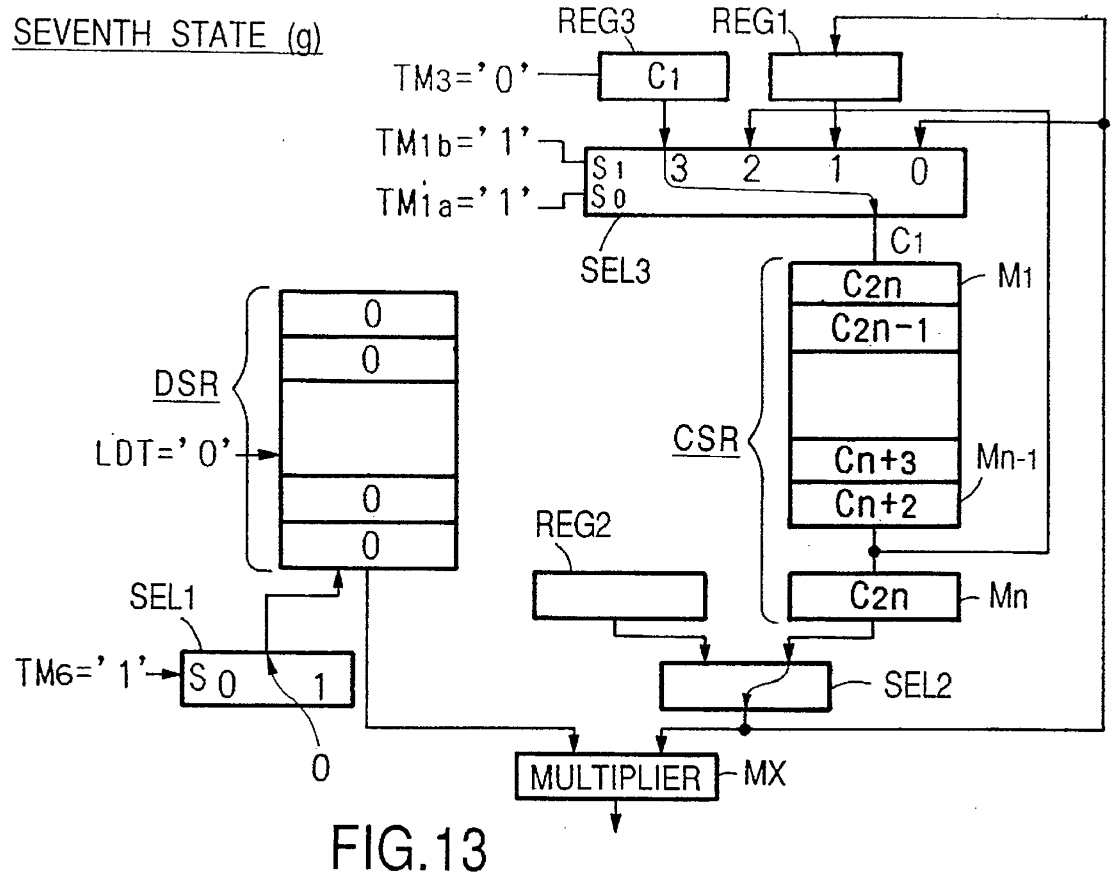
FIG. 13 is a block diagram showing a main part of the DSP in connection with a seventh state (g)
Figure 14:
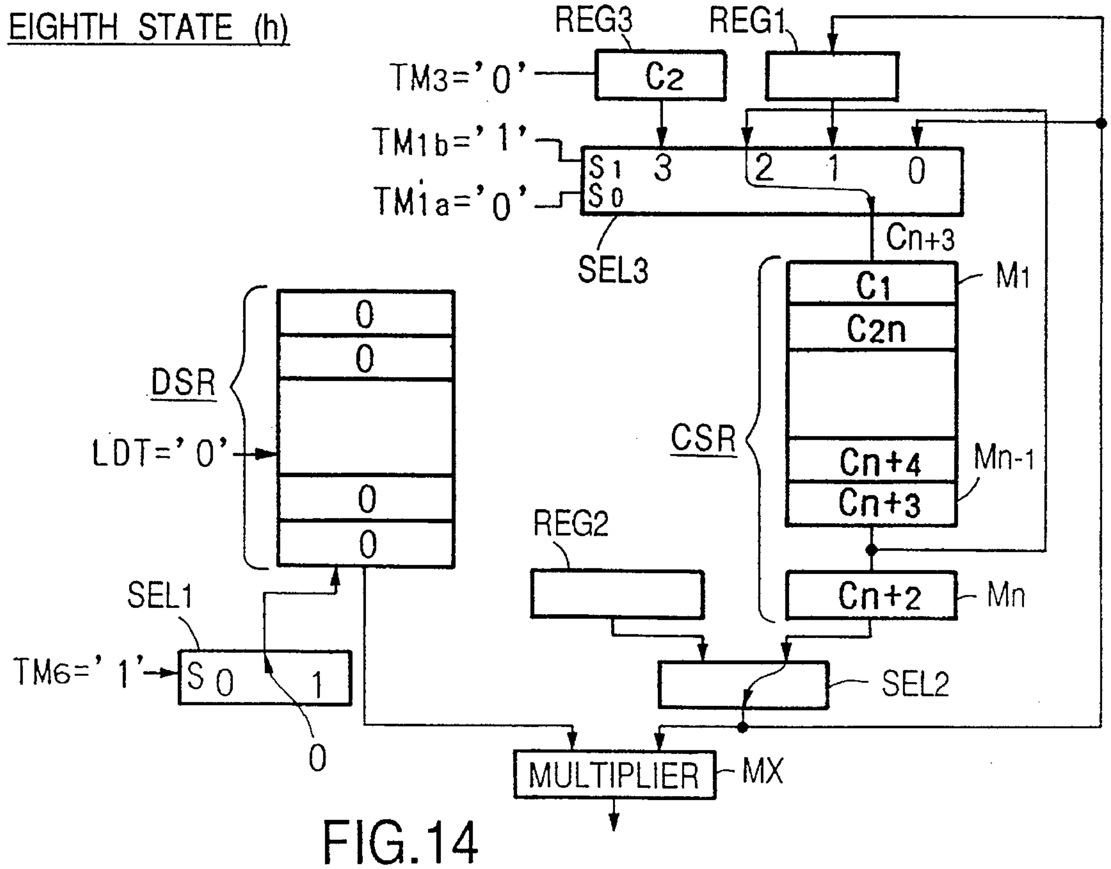
FIG. 14 is a block diagram showing a main part of the DSP in connection with an eighth state (h)
Figure 15:
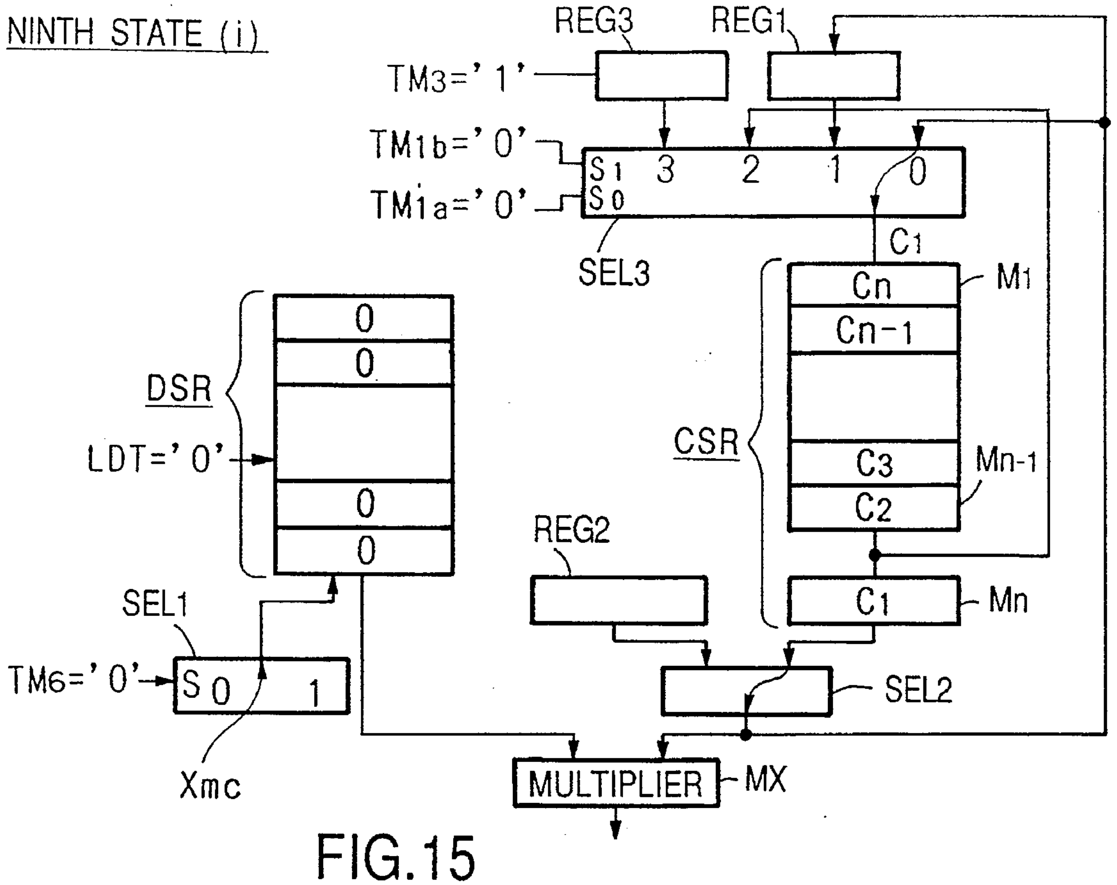
FIG. 15 is a block diagram showing a main part of the DSP in connection with a ninth state (i)

Now, the coefficients $C_1$ to $C_n$ are stored in respective storage areas of the coefficient shift register CSR, as shown in FIG. 7, at a leading-edge timing of a first master clock MCLK (see (a) in FIG. 5) in a certain sampling period '$T_m$'. This state will be referred to as a first state (a) (see FIG. 7). After the first state is established, the coefficients are shifted by one storage area of the coefficient shift register CSR in synchronism with each of the master clocks MCLK which are sequentially produced after the first master clock. Therefore, the coefficients $C_1$, $C_2$, . . . are sequentially supplied to the arithmetic convolution portion 20 through the selector SEL2. In addition, those coefficients are sequentially supplied to the first storage area $M_1$ of the coefficient shift register CSR as well through the selectors SEL4 and SEL3. During the sampling period $T_m$, the 'n' master clocks MCLK are produced, so that the coefficients circulates once. After the sampling period $T_m$ ends, a new sampling period $T_{m+1}$ starts. When the new sampling period $T_{m+1}$ is started (see (b) in FIG. 5), the coefficient shift register CSR stores the coefficients $C_1$ to $C_n$ as shown in FIG. 8.

In the arithmetic convolution portion 20, the multiplier MX sequentially inputs the sampling data $X_m$, $X_{m-1}$, . . . and $X_{m-n+1}$ in one sampling period. The multiplier MX receives each of the coefficients $C_1$ to $C_n$ through the selector SEL2 in synchronism with each of the sampling data $X_m$ to $X_{m-n+1}$. Hence, after the completion of one sampling period, the accumulator ACC accumulates the results of arithmetic convolution "$Y_m$", as follows:

$$Y_m=\Sigma_{k=1}^{n} C_k \cdot X_{m-k+1} \quad (1)$$

When the sampling period is changed from $T_m$ to $T_{m+1}$, new sampling data $X_{m+1}$ is supplied to the data shift register DSR. At this timing (see (b) in FIG. 5), the data shift register DSR stores a string of sampling data $X_{m+1}$ to $X_{m-n+2}$ as shown in FIG. 8. In other words, a second state (b) as shown in FIG. 8 is established. In the sampling period $T_{m+1}$, the arithmetic convolution is performed, using the coefficients $C_1$ to $C_n$ stored in the coefficient shift register CSR, on the sampling data $X_{m+1}$ to $X_{m-n+2}$ stored in the data shift register DSR shown in FIG. 8.

(2) Second Situation

The second situation is defined as the situation where the amplitude level of the audio signal inputted is changed from high level to low level. In a sampling period $T_{ma}$ which corresponds to the second situation, the amplitude level of the audio signal inputted is set at almost zero level, so that the level detection circuit 41 outputs the level-detection signal LDT which is at '1' level. In that case, the following operations are performed by the DSP.

At first, when the level-detection signal LDT is changed in level from '0' to '1', the coefficient input/output control portion 42 sets the control signal $TM_5$ at '1' level. The result of the exclusive-OR operation applied to the level-detection signal LDT and the control signal $TM_5$ is indicated by a number '0'. Hence, the level of the control signal $TM_6$ is maintained at '0' level. After the level-detection signal LDT is changed in level from '0' to '1' while the level of the control signal $TM_6$ is maintained at '0' level, the read-out control circuit 302 controls the coefficient temporary RAM 301 such that one coefficient is read out in one sampling period. Hence, the coefficients $C_{n+1}$, $C_{n+2}$, . . . are sequentially read from the coefficient temporary RAM 301. If a string of coefficients $C_1$ to $C_n$, stored in the coefficient shift register CSR, correspond to a former-half sounds within the long-time reflected sounds, a string of coefficients $C_{n+1}$, $C_{n+2}$, . . . correspond to a latter-half sounds succeeded. The coefficients $C_{n+1}$, $C_{n+2}$, . . . , read from the coefficient temporary RAM 301, are supplied to the register REG3 through the interface circuits $IF_6$ and $IF_3$ (see FIG. 4).

When the level-detection signal LDT is changed in level to '1', the control signals $TM_{1a}$, $TM_{1b}$, $TM_2$, $TM_3$ and $TM_4$ are changed in level as well.

In the duration of the first master clock in each sampling period, the control signal $TM_3$ is retained in level at '0'.

In the time interval in which the level-detection signal LDT is retained in level at '1', the control signal $TM_{1b}$ is normally set at '1'; and the control signal $TM_{1a}$ is set at '1' only in the duration to be measured between a first moment, at which the last master clock is outputted in each sampling period, and a second moment at which the next master clock is outputted, while the control signal $TM_{1a}$ is retained in level at '0' in the other durations. In each sampling period, the selector SEL3 selects the coefficient data, stored in the (n−1)th register $M_{n-1}$ of the coefficient shift register CSR, until the last master clock is outputted. In each sampling period, when the last master clock is outputted, the selector SEL3 selects the data stored in the register REG3.

As similar to the foregoing first situation where the amplitude level of the audio signal inputted is relatively high, the control signal $TM_2$ is normally set at '0'.

Next, the detailed description will be given with respect to a manner of transition in the stored contents of each register.

Firstly, when a first master clock MCLK is outputted in the sampling period $T_{ma}$ which begins just after the level-detection signal LDT is turned in level to '1', the coefficients $C_1$ to $C_n$ are respectively stored in the registers $M_1$ to $M_n$ of the coefficient shift register CSR. This state is called a third state (c) which is established at a moment (c) in FIG. 5 and which corresponds to the configuration shown in FIG. 9.

In the third state (c), the control signal $TM_3$, which is normally set at '1', is set at '0' during a duration which corresponds to one period of the master clock MCLK. In the duration where the control signal $TM_3$ is retained in level at '0', when the pulse of the master clock MCLK rises, the coefficient $C_{n+1}$, which is currently given from the interface circuit IF3, is written into the register REG3 (see FIG. 9). After that duration, the level of the control signal $TM_3$ is returned to '1'; thereafter, even when the master clock MCLK is inputted, the register REG3 continuously retains the coefficient $C_{n+1}$ therein.

In a duration, in which the DSP receives the first master clock to the (n−1)th master clock in the sampling period $T_{ma}$, the level of the control signal $TM_{1a}$ is retained at '0'. In that duration, the output of the register $M_{n-1}$ is selected by the selector SEL3 and is inputted into the register $M_1$. Then, the circulation-type shift register, having 'n−1' stages, which is configured by the registers $M_1$ to $M_{n-1}$ and the selector SEL3, performs the circulatory shift on a string of coefficients $C_2$ to $C_n$. In that circulatory shift, the output of the register $M_{n-1}$ is delayed, in the register $M_n$, by a certain delay time which corresponds to one period of the master clock MCLK; and then, the delayed output is supplied to the arithmetic convolution portion 10 through the selector SEL2. Herein, the coefficient $C_1$, which is outputted from the selector SEL2 in synchronism with the first master clock MCLK, is not fed back to the register $M_1$ and is eventually excluded from a string of coefficients which circulate in the coefficient shift register CSR. At a timing when the last n-th master clock MCLK is outputted in the sampling period $T_{ma}$, the register $M_n$ stores the coefficient $C_n$, while the registers $M_{n-1}$ to $M_1$ respectively store the coefficients $C_2$ to $C_n$. This state is called a fourth state which is established at a moment (d) in FIG. 5 and which corresponds to the configuration shown in FIG. 10.

When the last n-th master clock MCLK is outputted in the sampling period $T_{ma}$, the control signal $TM_{1a}$ is changed in level to '1'; therefore, the coefficient $C_{n+1}$ stored in the register REG3 is selected by the selector SEL3 and is supplied to the register $M_1$.

When the sampling period is changed over from '$T_{ma}$' to '$T_{ma+1}$', the coefficient $C_{n+1}$ is written into the register $M_1$ in response to a first master clock MCLK in the new sampling period $T_{ma+1}$. Thus, the register $M_n$ stores the coefficient $C_2$, while the registers $M_{n-1}$ to $M_1$ respectively store the coefficients $C_3$ to $C_{n+1}$. This state is called a fifth state which is established at a moment (e) in FIG. 5 and which corresponds to the configuration shown in FIG. 11. When the first master clock MCLK is outputted in the sampling period $T_{ma+1}$, the control signal $TM_3$ is changed in level to '0'. Thus, the coefficient $C_{n+2}$, which is outputted from the interface circuit IF3 at that moment, is written into the register REG3. Thereafter, as similar to the foregoing sampling period $T_{ma}$, in a duration in which the DSP receives the first master clock to the (n−1)th master clock in the sampling period $T_{ma+1}$, the control signal $TM_{1a}$ is retained in level at '0'. In that duration, the circulation-type shift register, having 'n−1' stages, which is configured by the registers $M_1$ to $M_{n-1}$ and the selector SEL3, performs the circulatory shift on a string of coefficients $C_3$ to $C_{n+1}$. In the circulatory shift, the output of the register $M_{n-1}$ is delayed, in the register $M_n$, by a certain delay time which corresponds to one period of the master clock MCLK; and then, the delayed output is supplied to the arithmetic convolution portion 20 through the selector SEL2. In the sampling period $T_{ma+1}$, the coefficient $C_2$ is outputted from the selector SEL2 in synchronism with the first master clock MCLK. However, this coefficient $C_2$ is not fed back to the register $M_1$ and is excluded from a string of coefficients which circulate in the coefficient shift register CSR.

As described above, when the amplitude level of the audio signal inputted is reduced to the low level, the level-detection signal LDT is changed in level to '1'. In the duration in which the level-detection signal LDT is retained in level at '1', the coefficients $C_1$, $C_2$, . . . are sequentially abandoned every time the sampling period is changed over. Moreover, every time the sampling period is changed over, the coefficients $C_{n+1}$, $C_{n+2}$, . . . , which are used to impart the long-time reverberation to the audio signal, are sequentially read from the coefficient temporary RAM 301. Those coefficients are sequentially supplied to the coefficient shift register CSR through the interface circuits IF6, IF3, the register REG3 and the selector SEL3, so that each of them is added as the last of the coefficients stored in the coefficient shift register CSR.

By repeating the above-mentioned circulatory shift for the coefficients, a string of coefficients, which are outputted from the coefficient processing portion 30 and are supplied to the arithmetic convolution portion 20, are changed every time the sampling period progresses. If the sampling period progresses in an order of ①, ②, . . . (see below), a string of coefficients, which are supplied to the arithmetic convolution portion 20, are changed as follows:

① $C_1$, $C_2$, . . . , $C_{n-1}$, $C_n$

② $C_2$, $C_3$, . . . , $C_n$, $C_{n+1}$

③ $C_3$, $C_4$, . . . , $C_{n+1}$, $C_{n+2}$

In short, every time the sampling period is changed over, a string of coefficients are changed to those corresponding to a latter part in the reflected sounds.

In the arithmetic convolution portion 20, the level-detection signal LDT, which is at '1' level, is supplied to the data shift register DSR. Thus, new sampling data is inhibited from being written into the data shift register DSR; and the data shift register DSR does not perform the data shift. Therefore, even when the sampling period is changed over, the data shift register DSR continuously retains a set of sampling data $X_{ma}$ to $X_{ma-n+1}$ which are stored therein before the level-detection signal LDT is turned in level to '1'. Therefore, in all of the states (c) to (e) shown in FIGS. 9 to 11, those sampling data are retained in the data shift register DSR without being changed. Therefore, in each of the sampling periods which sequentially emerge under the condition where the level-detection signal LDT is retained in level at '1', the sampling data $X_{ma}$ to $X_{ma-n+1}$ are normally read from the data shift register DSR and are sequentially supplied to the multiplier MX.

As described heretofore, under the condition where the amplitude level of the audio signal inputted is relatively low, the arithmetic convolution is performed on a string of sampling data, which are fixed, by using a string of coefficients which are changed, in each sampling period, to those corresponding to a latter part of the reflected sounds shown in FIG. 1.

(3) Third Situation

In the third situation, the amplitude level of the audio signal inputted is changed from low level to high level. This situation emerges at a sampling period $T_{mb}$ (see FIG. 6), in which the level-detection signal LDT is changed in level to '0' because the amplitude level of the audio signal inputted becomes relatively high. Thus, the following operations are performed by the DSP.

In a duration in which a certain time has been passed after the level-detection signal LDT is changed in level to '0', the control signal $TM_5$ is retained in level at '1'. As a result, the control signal $TM_6$ is changed in level to '1' and is retained at '1' in the above duration. After the level-detection signal LDT is changed in level to '0' and the control signal $TM_6$ is changed in level to '1', the read-out control circuit 302 controls the coefficient temporary RAM 301 so that one coefficient is read out in each sampling period. Thus, the coefficients $C_1$ to $C_n$ are sequentially read from the coefficient temporary RAM 301. Those coefficients are supplied to the register REG3 through the interface circuits IF6 and IF3.

Since the level-detection signal LDT is changed in level to '0', the control signals $TM_{1a}$, $TM_{1b}$, $TM_2$, $TM_3$ and $TM_4$ are correspondingly changed in level.

As for the control signal $TM_3$, a certain level change is repeated in the aforementioned duration. That is, the control signal $TM_3$, whose level is normally set at '1', is changed in level to '0' in synchronism with a first master clock which is firstly outputted in each sampling period. As a result, the coefficient data, which is supplied to the register REG3 through the interface circuits IF6 and IF3, is written into the register REG3 in response to the first master clock.

The control signal $TM_{1b}$ is retained in level at '1' in the aforementioned duration. The control signal $TM_{1a}$, whose level is normally set at '0', is changed in level to '1' in a certain duration to be measured between a first moment, at which a last master clock is outputted in each sampling period, and a second moment at which its next master clock is outputted.

As similar to the situation where the amplitude level of the audio signal inputted is relatively low, the control signal $TM_2$ is normally set at '0'.

When a first master clock is outputted in the sampling period in which the level-detection signal LDT is changed in level to '0', a clear signal CLR, which is normally set at '1', is changed in level to '0'. In response to the clear signal CLR, which is at '0' level, the data shift register DSR is cleared.

Next, a manner of transition will be described with respect to the stored contents of each register.

For convenience' sake, it is assumed that the coefficients $C_{n+1}$ to $C_{2n}$ are respectively stored in the registers $M_n$ to $M_1$ (see FIG. 12) in the sampling period $T_{mb}$ which begins just after the level-detection signal LDT is changed in level to '0'. This state is called a sixth state which is established at a moment (f) in FIG. 6 and which corresponds to the configuration shown in FIG. 12.

In the sixth state, the control signal $TM_3$ is changed in level to '0' when a first master clock is outputted in the sampling period $T_{mb}$ (see (f) in FIG. 6). At that moment, the coefficient $C_1$, which is supplied from the interface circuit IF3, is written into the register REG3 (see FIG. 12). Then, the control signal $TM_3$ is returned in level to '1'. Thereafter, even when the master clock is outputted, the register REG3 retains the coefficient $C_1$ therein.

In a duration in which the first to (n−1)th master clocks are outputted in the sampling period $T_{mb}$, the control signal $TM_{1a}$ is retained in level at '0'. Thus, the circulation-type shift register, having 'n−1' stages, which is configured by the registers $M_1$ to $M_{n-1}$ and the selector SEL3, performs the circulatory shift on a string of coefficients $C_{n+2}$ to $C_{2n}$. Incidentally, the coefficient $C_{n+1}$, which is outputted from the selector SEL2 in synchronism with the first master clock, is not fed back to the register $M_1$ and is excluded from a string of coefficients which circulate in the coefficient shift register CSR. When the last n-th master clock is outputted in the sampling period $T_{mb}$, the register $M_n$ stores the coefficient $C_{2n}$, while the registers $M_{n-1}$ to $M_1$ respectively store the coefficients $C_{n+2}$ to $C_{2n}$. This state is called a seventh state which is established at a moment (g) in FIG. 6 and which corresponds to the configuration shown in FIG. 13.

In response to the last n-th master clock which is outputted in the sampling period $T_{mb}$, the control signal $TM_{1a}$, whose level is normally retained at '0', is changed in level to '1'. Hence, the coefficient $C_1$, stored in the register REG3 (see FIG. 13), is selected by the selector SEL3 and is supplied to the register $M_1$.

When the sampling period is changed over to a new sampling period '$T_{mb+1}$', the coefficient $C_1$, which is currently supplied to the register $M_1$, is written into the register $M_1$ in response to a first master clock in the sampling period $T_{mb+1}$. Thus, the register $M_n$ stores the coefficient $C_{n+2}$, while the registers $M_{n-1}$ to $M_2$ respectively store the coefficients $C_{n+3}$ to $C_{2n}$ (see FIG. 14). This state is called a eighth state which is established at a moment (h) in FIG. 6 and which corresponds to the configuration shown in FIG. 14. Meanwhile, when the first master clock is outputted in the sampling period $T_{mb+1}$, the control signal $TM_3$ is changed in level to '0'. At that moment, the coefficient $C_2$, which is outputted from the interface circuit IF3, is written into the register REG3. As similar to the foregoing sampling period $T_{mb}$, in a duration in which the first to (n−1)th master clocks are outputted in the sampling period $T_{mb+1}$, the control signal $TM_{1a}$ is retained in level at '0', so that the circulatory shift is performed on the coefficients $C_{n+3}$ to $C_{2n}$ and $C_1$. Incidentally, the coefficient $C_{n+2}$ is outputted from the selector SEL2 in synchronism with a first master clock in the sampling period $T_{mb+1}$; however, this coefficient $C_{n+2}$ is not fed back to the register $M_1$ and is excluded from a string of coefficients which circulate in the coefficient shift register CSR.

As described heretofore, after the amplitude level of the audio signal inputted is changed from low level to high level so that the level-detection signal LDT is changed in level to '0', a head coefficient in a string of coefficients, which circulate in the coefficient shift register CSR, is abandoned in an order of $C_{n+1}$, $C_{n+2}$, . . . every time the sampling period is changed over. In response to the progress of the sampling periods, the coefficients $C_1$, $C_2$, . . . , which correspond to the normal reverberation to be imparted, are sequentially read from the coefficient temporary RAM 301 and are supplied to the coefficient shift register CSR through the interface circuits IF6, IF3, the register REG3 and selector SEL3. Thus, each of those coefficients is added as a last coefficient in a string of coefficient stored by the coefficient shift register CSR.

In response to a progress of sampling periods ①-④ (see below), a string of coefficients, which are supplied to the arithmetic convolution portion 20 from the coefficient processing portion 30, are changed as follows:

① $C_{n+1}$, $C_{n+2}$, . . . , $C_{2n-1}$, $C_{2n}$

② $C_{n+2}$, $C_{n+3}$, . . . , $C_{2n}$, $C_1$

③ $C_{n+3}$, $C_{n+4}$, . . . , $C_1$, $C_2$

.

.

.

④ $C_1$, $C_2$, . . . , $C_{n-1}$, $C_n$

Finally, a string of coefficients, stored by the coefficient shift register CSR, are returned to a string of coefficients $C_1$ to $C_n$ which corresponds to the normal reverberation to be imparted.

The data shift register DSR receives the clear signal CLR at a first moment of the sampling period $T_{mb}$ so that the stored contents thereof are cleared. In the certain duration in which the certain time has been passed after the beginning of the sampling period $T_{mb}$, the control signal $TM_6$ is retained in level at '1'. Thus, the selector SEL1 selects the fixed number '0', which is then supplied to the data shift register DSR. Therefore, in the above duration, all of the storage areas of the data shift register DSR store the same number '0'. This means that in that duration, the result of the arithmetic convolution, which is performed by the arithmetic convolution portion 20, is equal to '0'.

When the above duration is passed away, a string of coefficients $C_1$ to $C_n$, which correspond to the normal reverberation to be imparted, are completely written in the coefficient shift register CSR. Thereafter, all of the control signals $TM_{1b}$, $TM_{1a}$, $TM_2$, $TM_4$, $TM_5$ and $TM_6$ are set at '0' level, while the control signal $TM_3$ is set at '1' level. This state is called a ninth state which is established at a moment (i) in FIG. 6 and which corresponds to the configuration shown in FIG. 15. After the ninth state is established, every time the sampling period is changed over, each of sampling data $X_{mc}$, $X_{mc+1}$, . . . newly issued is written into the data shift register DSR so that the arithmetic convolution is performed, using a string of coefficients $C_1$ to $C_n$, on a set of sampling data which have been previously written in the data shift register DSR.

(4) Fourth Situation

The DSP according to the present embodiment can be also used in the fourth situation where the coefficient, given from the external device, is added to a string of coefficients used for the arithmetic convolution. However, since those operations have been described in detail in Japanese Patent Application No. 2-13387 which corresponds to Japanese Patent Laid-Open No. 3-217112, the description of those operations will be omitted.

Anyway, as described heretofore, the present invention can impart the long-time reverberation, which is picked up in the church or the like, to the audio signals by the DSP which has a limited tap number.

[D] Second Embodiment

The first embodiment is designed such that all of the coefficients, stored in the coefficient shift register CSR, are replaced by the coefficients which correspond to the long-time reverberation. In the second embodiment, a string of sampling data, representative of the audio signal inputted, on which the arithmetic convolution is performed, are divided into a former-half part and a latter-half part; and a string of coefficients, used for the arithmetic convolution, are also divided into a former-half part and a latter-half part. The second embodiment is characterized by that when the amplitude level of the audio signal inputted becomes relatively low, the latter-half part of the coefficients is replaced by a latter part of the coefficients, which are provided for the long-time reverberation to be imparted, while the latter-half part of the sampling data is fixed as it is.

Figure 16:
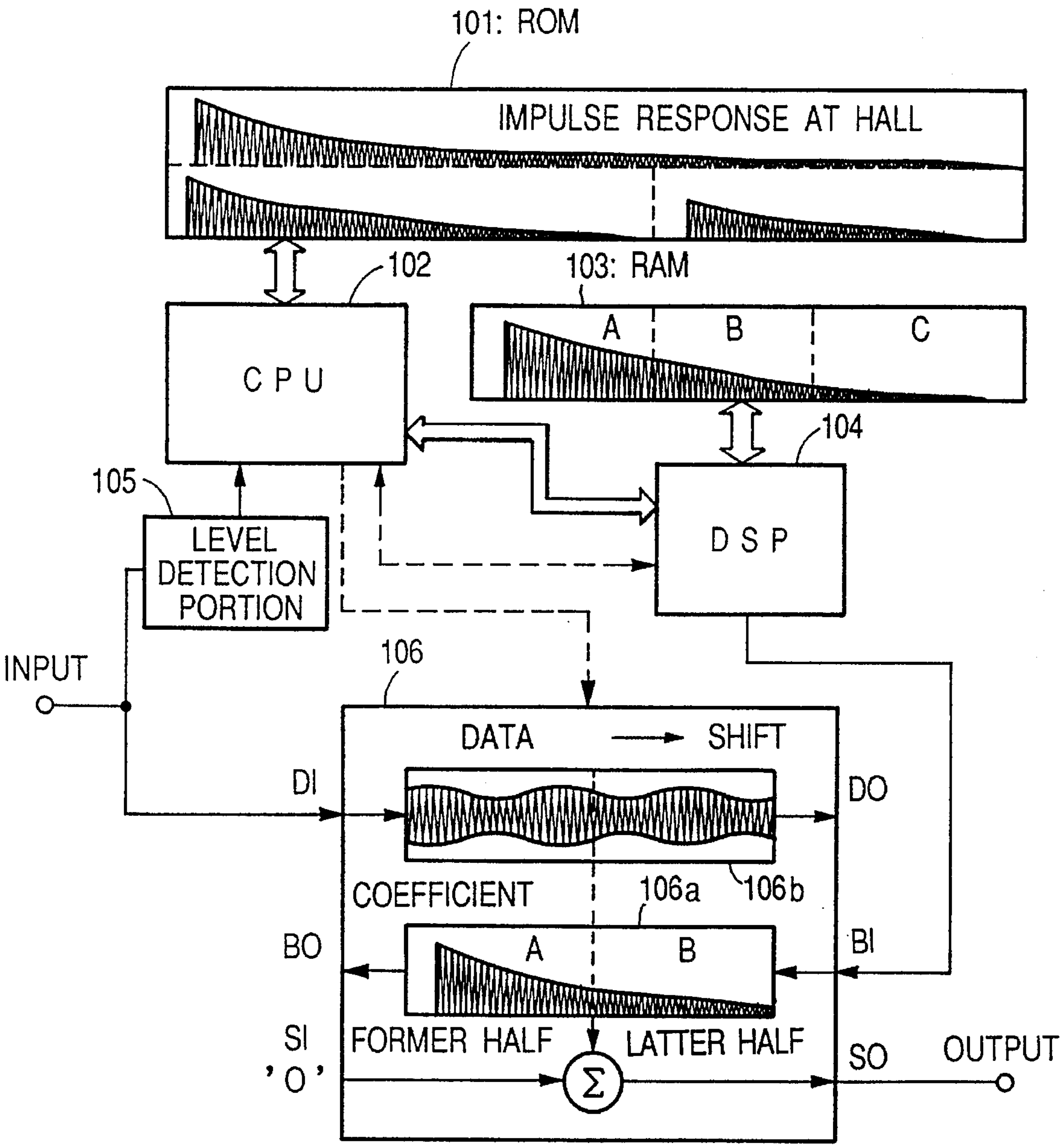
FIG. 16 is a block diagram showing a configuration of a reverberation imparting apparatus according to a second embodiment of the present invention.

FIG. 16 shows a simple configuration of the reverberation imparting apparatus according to the second embodiment. In FIG. 16, a ROM 101 stores a set of sampling data, representative of the reflected sounds which are picked up in the certain sound-field space, as a string of coefficients used for the reverberation imparting. A RAM 103 is provided to temporarily store a string of coefficients. A DSP 104 is controlled by a central processing unit (i.e., CPU) 102 to send the coefficients, stored in the RAM 103, to an arithmetic convolution unit 106. The arithmetic convolution unit 106 has two memories, i.e., a coefficient memory 106a and a sampling-data memory 106b. The coefficient memory 106a stores a string of coefficients which are supplied thereto through the DSP 104, while the sampling-data memory 106b stores a string of sampling data representative of the audio signal inputted. Thus, the arithmetic convolution unit 106 performs the arithmetic convolution, using a string of coefficients, on a string of sampling data, so that the result of arithmetic convolution is outputted therefrom. Herein, the coefficient memory 106a stores each of the former-half part and latter-half part independently with respect to a string of coefficients. Similarly, the sampling-data memory 106b stores each of the former-half part and latter-half part independently with respect to a string of sampling data. The following control operations (a) to (c) can be performed on each of those memories 106a and 106b.

(a) In each sampling period, the sampling data inputted is written into the sampling-data memory 106b, while the sampling data previously stored are shifted in the sampling-data memory 106b.

(b) In the sampling-data memory 106b, the writing operation of the sampling data and the shifting operation of the sampling data are performed with respect to the former-half part of sampling data only, while the latter-half part of sampling data is fixed. In the coefficient memory 106a, the latter-half part of coefficients stored is replaced by a latter part of coefficients, representative of the reflected sounds, while the former-half part of coefficients is fixed. Herein, the latter part of coefficients is successively shifted to the coefficients representative of the reflected sounds which are picked up later.

(c) In each sampling period, the sampling data inputted is written into the sampling-data memory 106b, while the sampling data previously stored are shifted. In the coefficient memory 106a, a head coefficient in the latter-half of coefficients stored is replaced by an original coefficient, while the former-half of coefficients is fixed. The original coefficient is initially determined and is used for the arithmetic convolution to be performed when the long-time reverberation is not imparted.

In the arithmetic convolution unit 106, data applied to an input terminal SI is added to the result of arithmetic convolution; and then, the result of addition is outputted through an output terminal SO. In addition, the oldest sampling data among a string of sampling data which are inputted to the arithmetic convolution unit 106 through an input terminal DI is outputted from an output terminal DO in each sampling period. Therefore, by interconnecting multiple arithmetic convolution units in a cascade-connection manner, it is possible to configure one arithmetic convolution device having a large tap number.

A level detection portion 105 outputs a level-detection signal when the amplitude level of the audio signal inputted becomes lower than a threshold level which is determined in advance. The CPU 102 controls several portions in the reverberation imparting apparatus shown in FIG. 16. The following steps (i) and (ii) of processing are performed by the CPU 102.

(i) In response to the command which is initiated by operating a manual-operable member (not shown), a string of coefficients, which correspond to the sound-field space designated by the command, are read from the ROM 101 and are written into the RAM 103.

(ii) In response to the level-detection signal, a set of control signals, which are required for performing each of the aforementioned control operations (a) to (c), are supplied to the DSP 104 and the arithmetic convolution unit 106.

[E] Operations of Second Embodiment

Next, the operations of the second embodiment will be described in detail with respect to each of three situations.

(1) First Situation

In the first situation where the amplitude level of the audio signal inputted is relatively high, a sting of coefficients, corresponding to the normal reverberation which is not the long-time reverberation, are written into the coefficient memory 106a of the arithmetic convolution unit 106. The coefficients, temporary stored by the RAM 103, are classified into three groups which respectively correspond to three sections 'A', 'B' and 'C' of the RAM 103. The coefficients, corresponding to the normal reverberation described above, are stored in the sections A and B of the RAM 103. Hence, those coefficients are written into the coefficient memory 106a. In each sampling period, the sampling data, representative of the audio signal inputted, is written into the sampling-data memory 106b, so that the sampling data previously stored are shifted in the sampling-data memory 106b. Then, the arithmetic convolution is performed, using a string of coefficients stored in the coefficient memory 106a, on a string of sampling data which are stored in the sampling-data memory 106b. The result of the arithmetic convolution is outputted from the output terminal SO.

(2) Second Situation

In the second situation where the amplitude level of the audio signal inputted becomes lower, the level detection portion 105 outputs the level-detection signal. In response to the level-detection signal, the CPU 102 outputs an instruction to transfer the coefficients, used for imparting the long-time reverberation, to the DSP 104. In addition, the CPU 102 also outputs control information, representative of the designation to impart the long-time reverberation, to the arithmetic convolution unit 106.

Figure 17:
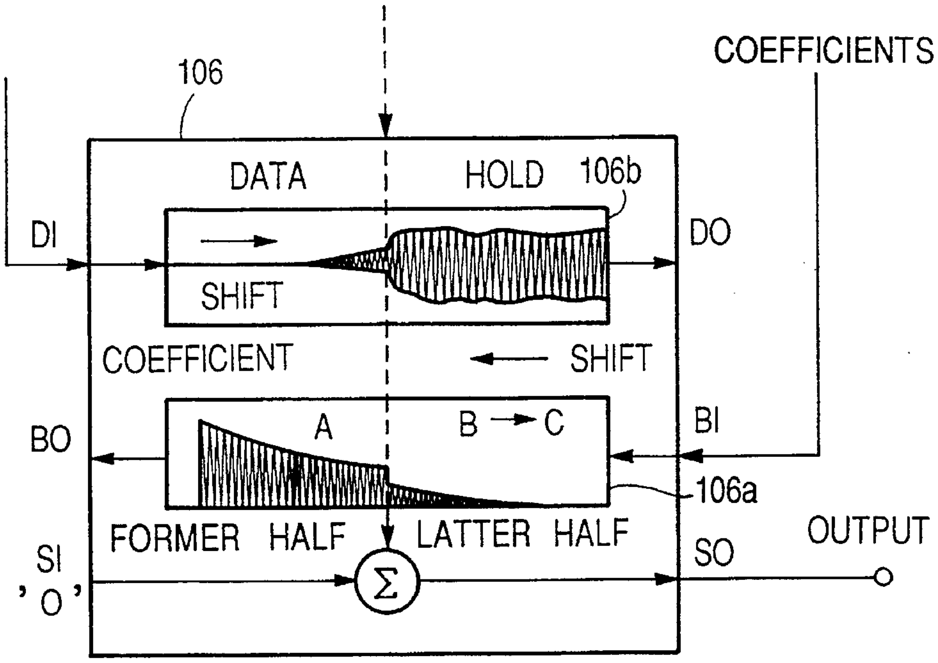
FIG. 17 is a block diagram showing an internal state of an arithmetic convolution unit shown in FIG. 16.

As a result, the DSP 104 controls the RAM 103 such that a string of coefficients, stored in the section C of the RAM 103, are sequentially read out from its head coefficient. Those coefficients are supplied to the arithmetic convolution unit 106. As for the sampling data stored in the sampling-data memory 106b of the arithmetic convolution unit 106, the writing operation of new sampling data and the shifting operation are performed with respect to the former-half part only, while the latter-half part is fixed. As for the coefficients stored in the coefficient memory 106a, the former-half part is fixed, while the coefficient, newly supplied from the DSP 104, is inputted to the coefficient memory 106a through an input terminal BI as the latter-half part of coefficients so that the latter-half part of coefficients stored is shifted backward. As a result, the latter-half part of coefficients stored in the coefficient memory 106a is replaced by those corresponding to a latter part of the reflected sounds. In other words, the latter-half part of coefficients is replaced by a set of coefficients which are successively shifted from the coefficients stored in the section B to the coefficients stored in the section C. FIG. 17 shows a manner of successive shift in the coefficients.

The arithmetic convolution is performed, using the latter-half part of coefficients, stored in the coefficient memory 106a, on the latter-half part of sampling data stored in the sampling-data memory 106b. Herein, the latter-half part of sampling data is fixed, but the latter-half part of coefficients is replaced by those corresponding to a latter part of reflected sounds which is successively shifted along the time axis by each sampling period. Thus, as similar to the foregoing first embodiment, the second embodiment can impart the long-time reverberation to the audio signal. On the other hand, the arithmetic convolution is performed, using the fixed former-half part of coefficients, on the former-half part of sampling data which is successively shifted by each sampling period.

(3) Third Situation

In the third situation where the amplitude level of the audio signal inputted, which was reduced to the low level, is returned to the high level, the level detection portion 105 releases the level-detection signal to be outputted. Thus, the CPU 102 sends an instruction, by which the coefficients, used for imparting the normal reverberation to the audio signal, are transferred, to the DSP 104. In addition, the CPU 102 sends another instruction, for returning the current state to the state which is suitable for imparting the normal reverberation to the audio signal, to the arithmetic convolution unit 106.

Figure 18:
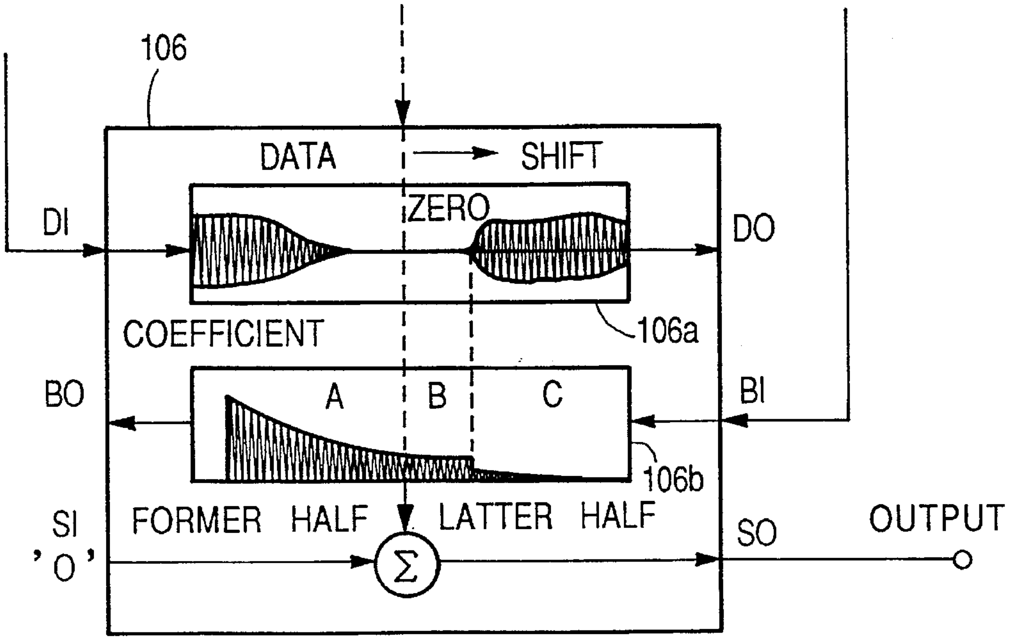
FIG. 18 is a block diagram showing another internal state of the arithmetic convolution unit.

Under the operations of the DSP 104 which is activated responsive to the instruction given from the CPU 102, the coefficients, stored in the section B of the RAM 103 shown in FIG. 16, are sequentially read out from their head coefficient, and are sent to the arithmetic convolution unit 106. In the arithmetic convolution unit 106, in each sampling period, new sampling data is written into the sampling-data memory 106b, while all of the sampling data, previously stored in the sampling-data memory 106b, are shifted. The former-half part of the coefficients stored in the coefficient memory 106a is fixed. On the other hand, the coefficients given from the DSP 104 are sequentially inputted to the coefficient memory 106a through the input terminal BI and are used as the latter-half part of coefficients. Hence, the coefficients for the latter-half part are sequentially replaced by the coefficients, inputted through the input terminal BI, from their head coefficient. FIG. 18 shows a manner of successive shift in the coefficients described above.

As described above, the coefficients for the latter-half part are sequentially replaced by the coefficients, stored in the section B of the RAM 103, from their head coefficient. Those coefficients, which are newly used as the latter-half part of coefficients, are multiplied by the sampling data, the level of which is roughly equal to zero as shown in FIG. 18. Therefore, it is possible to minimize the possibility in which the replacement of the coefficients may cause a big change in the result of arithmetic convolution. Meanwhile, the coefficients, stored in the section A of the RAM 103, which correspond to the normal reverberation, are stored in the coefficient memory 106*a* as the former-half part of coefficients; and the arithmetic convolution is performed, using those coefficients, on the former-half part of sampling data. For this reason, even if the amplitude level of the audio signal inputted is returned from roughly zero level to the relatively high level, it is possible to impart the reverberation to the audio signal newly inputted without causing any break in sounding.

[F] Third Embodiment

In the first embodiment described before, when the amplitude level of the audio signal inputted is returned from low level to high level, the stored contents of the data shift register DSR is once cleared, and then, the replacement of the coefficients is performed on the coefficient shift register CSR. The reasons will be described below.

For convenience' sake, it is assumed that when the amplitude level becomes large so that the level-detection signal is cleared, the coefficient shift register CSR and the data shift register DSR have the contents, in a first sampling period, as follows:

① First sampling period

| | | | | | |
|---|---|---|---|---|---|
| CSR: | $C_{n+1}$, | $C_{n+2}$, | . . . , | $C_{2n-1}$, | $C_{2n}$ |
| DSR: | $X_{mb}$, | $X_{mb-1}$, | . . . , | $X_{mb-n+2}$, | $X_{mb-n+1}$ |

Now, the data input and data shift are restarted in the data shift register DSR without clearing the above-mentioned contents of the data shift register DSR, while the coefficients, stored in the coefficient shift register CSR, are returned to the coefficients $C_1$ to $C_n$. In that case, undesired change occurs in the coefficients, stored in the coefficient shift register CSR, as well as in the sampling data stored in the data shift register DSR, so that the arithmetic convolution should be performed in totally false manner. Herein, the totally false manner can be described as the non-natural phenomenon in which the arithmetic convolution is performed, using the coefficients $C_1$ to $C_n$ which should be used for the sampling data recently produced, on the sampling data which had been previously produced. When such non-natural phenomenon occurs, the contents of the shift registers CSR and DRS are changed in accordance with a progress of the sampling periods, as follows:

② Second sampling period which emerges one sampling period later than the first sampling period.

| | | | | | |
|---|---|---|---|---|---|
| CSR: | $C_{n+2}$, | $C_{n+3}$, | . . . , | $C_{2n}$, | $C_1$ |
| DSR: | $X_{mc}$, | $X_{mb}$, | . . . , | $X_{mb-n+3}$, | $X_{mb-n+2}$ |

③ Third sampling period which emerges two sampling periods later than the first sampling period.

| | | | | | |
|---|---|---|---|---|---|
| CSR: | $C_{n+3}$, | $C_{n+4}$, | . . . , | $C_1$, | $C_2$ |
| DSR: | $X_{mc+1}$, | $X_{mc}$, | . . . , | $X_{mb-n+4}$, | $X_{mb-n+3}$ |

"$X_{mc}$" and "$X_{mc+1}$" described above are the sampling data which are produced after the level-detection signal LDT is cleared.

The above-mentioned undesired changes in the coefficients and sampling data are repeated until all of the coefficients $C_1$ to $C_n$ are set to the coefficient shift register CSR. In order to prohibit the false results of arithmetic convolution from being produced, the first embodiment is designed such that all of data stored in the data shift register DSR are set at '0' until the coefficients are completely replaced by $C_1$ to $C_n$.

In the first embodiment, during the progress in replacement of the coefficients $C_1$ to $C_n$, the results of the arithmetic convolution are all equal to zero, in other words, the sounding is broken for a while. As compared to the first embodiment, the third embodiment is improved in such a manner that even when the amplitude level of the audio signal inputted is returned from low level to high level, the signal processing for imparting the reverberation to the audio signal can be performed without causing any break in sounding.

Next, the operations of the third embodiment will be described in detail with respect to the situation where the amplitude level of the audio signal inputted is returned from low level to high level. The coefficients and sampling data, used by the third embodiment, are changed, as follows:

① A certain timing before the level-detection signal LDT is cleared.

| | | | | | |
|---|---|---|---|---|---|
| coefficients: | $C_{n+1}$, | $C_{n+2}$, | . . . , | $C_{2n-1}$, | $C_{2n}$ |
| sampling data: | $X_{mb}$, | $X_{mc}$, | . . . , | $X_{mb-n+4}$, | $X_{mb-n+3}$ |

② First sampling period which firstly emerges after the level-detection signal LDT is cleared.

| | | | | | |
|---|---|---|---|---|---|
| coefficients: | $C_1$, | $C_{n+2}$, | . . . , | $C_{2n-1}$, | $C_{2n}$ |
| sampling data: | $X_{mc}$, | $X_{mb}$, | . . . , | $X_{mb-n+3}$, | $X_{mb-n+2}$ |

③ Second sampling period which emerges next to the first sampling period.

| | | | | | |
|---|---|---|---|---|---|
| coefficients: | $C_1$, | $C_2$, | . . . , | $C_{2n-1}$, | $C_{2n}$ |
| sampling data: | $X_{mc+1}$, | $X_{mc}$, | . . . , | $X_{mb-n+4}$, | $X_{mb-n+3}$ |

Thus, the operations for the data shift register DSR are restarted, so that new sampling data is written in the data shift register DSR and the sampling data previously stored are shifted. In addition, the coefficients of the coefficient shift register CSR are sequentially replaced by the coefficients $C_1$ to $C_n$ from their head coefficient.

In the second sampling period "③" described above, the new sampling data $X_{mc+1}$ is multiplied by the coefficient $C_1$. This multiplication is performed in the normal arithmetic convolution which is executed when the amplitude level of the audio signal inputted is relatively high. In addition, the sampling data $X_{mc}$ to $X_{mb-n+3}$ are respectively multiplied by the coefficients $C_2$ to $C_{2n}$. Those multiplications are performed in the arithmetic convolution, which is executed when the amplitude level of the audio signal inputted is relatively low, by reducing the number of the sampling data as well as the number of the coefficients. Therefore, the final result in the arithmetic convolution described above creates the well-synthesized audio signal to which the reverberation is imparted.

Figure 19:
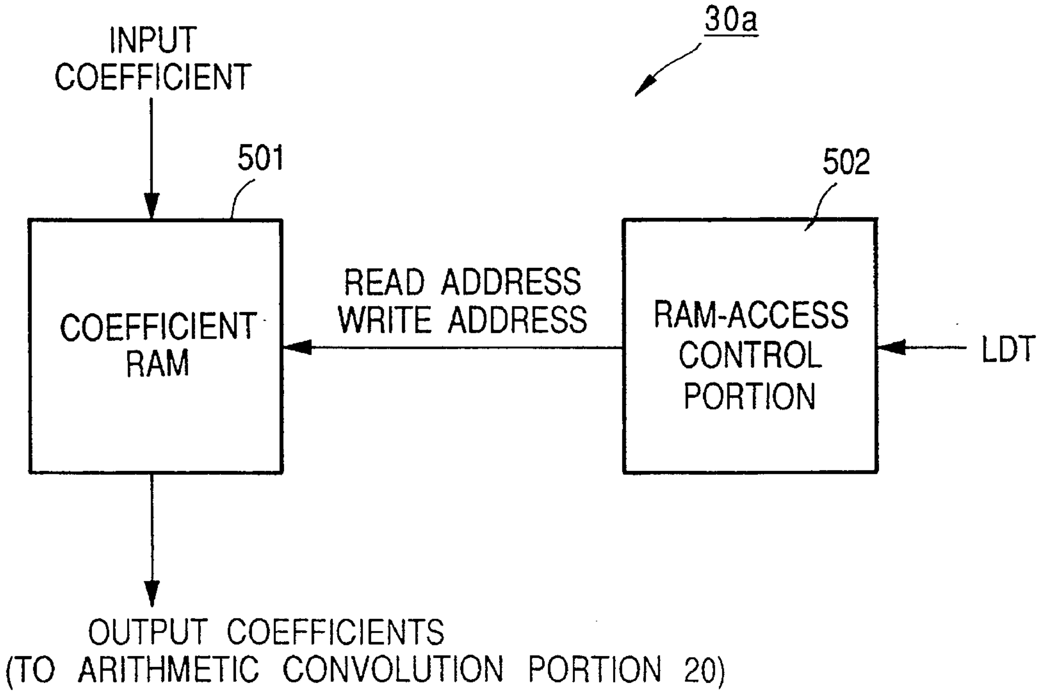
FIG. 19 is a block diagram showing a simplified configuration for a reverberation imparting apparatus according to a third embodiment of the present invention.

In order to enable the replacement by which the coefficients used for the arithmetic convolution are sequentially replaced by the coefficients $C_1$ to $C_n$ from their head coefficient, the configuration of the coefficient shift register CSR should be designed to do so. In order to do so, extremely complex circuit configuration may be required for the coefficient shift register CSR. This is not advantageous. For this reason, the third embodiment employs a circuit configuration, as shown in FIG. 19, as the aforementioned coefficient processing portion 30 employed by the first embodiment. As compared to the first embodiment, a RAM is used instead of the coefficient shift register CSR.

A coefficient processing portion 30*a*, shown in FIG. 19, employed by the third embodiment, comprises a coefficient RAM 501 and a RAM-access control portion 502. Herein, the coefficient RAM 501 has multiple addresses, the number of which is indicated by 'n' (where 'n' is an integral number); and the RAM-access control portion 502 outputs a read address or a write address to the coefficient RAM 501 so as to read or write the coefficient.

Next, the operations of the third embodiment will be described with respect to four situations.

(1) First Situation

In the first situation where the amplitude level of the audio signal inputted is relatively high, the RAM-access control portion outputs the read addresses so as to read out the coefficients $C_1$ to $C_n$ from the coefficient RAM 501; and those coefficients are supplied to the arithmetic convolution portion 20 (see FIG. 3). Herein, the read addresses are created by the RAM-access control portion 502 by adding an address offset 'L' to address 0 to address n−1. The details of the address offset L will be described later. Thus, as similar to the first embodiment, the arithmetic convolution is performed, using those coefficients, on a string of sampling data.

(2) Second Situation

In the second situation where the amplitude level of the audio signal inputted is changed to low level, the RAM-access control portion 502 performs three steps of processing (a) to (c) in each sampling period.

(a) First Step

The first step is provided to write the coefficients, corresponding to the latter part of reflected sounds, to the coefficient RAM 501. More specifically, in accordance with a progress of sampling periods which successively emerge after the level-detection signal LDT is produced, the coefficients $C_{n+1}$, $C_{n+2}$, . . . , which are succeeded after the coefficients $C_1$ to $C_n$, are sequentially inputted from the external device; and those coefficients are written into the coefficient RAM 501 at the write addresses which are determined based on the address offset L.

(b) Second Step

In parallel to the first step, the second step is carried out. In the second step, the RAM-access control portion 502 creates read address ADR, the number of which ranges from 'L+1' to 'L+n'. However, if the number of the read address ADR exceeds a number 'n−1', the number 'n−1' is subtracted from that number so as to obtain a new number for the read address ADR.

(c) Third Step

Every time one sampling period progresses, the address offset L is increased by '1'. If the address offset increased exceeds 'n−1', the address offset is forced to be set as follows: L=0.

If the address offset L is set at '0' before the processing in the second situation (2) is started, the relationship between the coefficients, stored in the coefficient RAM 501 at addresses 0 to n−1, and the coefficients read from the coefficient RAM 501 is changed in accordance with the progress of the sampling periods because of the execution of the processing in the second situation. The changes in the above relationship will be described below, together with a string of sampling data used for the arithmetic convolution.

① A certain timing before the level-detection signal LDT is produced.

| | | | | | |
|---|---|---|---|---|---|
| stored coefficients: | $C_1$, | $C_2$, | . . . , | $C_{n-1}$, | $C_n$ |
| coefficients read out: | $C_1$, | $C_2$, | . . . , | $C_{n-1}$, | $C_n$ |
| sampling data: | $X_{mb}$, | $X_{mb-1}$, | . . . , | $X_{mb-n+2}$, | $X_{mb-n+1}$ |

② First sampling period which firstly emerges after the level-detection signal LDT is produced.

| | | | | | |
|---|---|---|---|---|---|
| stored coefficients: | $C_{n+1}$, | $C_2$, | . . . , | $C_{n-1}$, | $C_n$ |
| coefficients read out: | $C_2$, | $C_3$, | . . . , | $C_n$, | $C_{n+1}$ |
| sampling data: | $X_{mb}$, | $X_{mb-1}$, | . . . , | $X_{mb-n+2}$, | $X_{mb-n+1}$ |

③ Second sampling period which emerges after the first sampling period.

| | | | | | |
|---|---|---|---|---|---|
| stored coefficients: | $C_{n+1}$, | $C_{n+2}$, | . . . , | $C_{n-1}$, | $C_n$ |
| coefficients read out: | $C_3$, | $C_4$, | . . . , | $C_{n+1}$, | $C_{n+2}$ |
| sampling data: | $X_{mb}$, | $X_{mb-1}$, | . . . , | $X_{mb-n+2}$, | $X_{mb-n+1}$ |

As described above, the shift processing is performed on the coefficients, while a string of sampling data, used by the arithmetic convolution portion 20, are fixed. Therefore, in the third embodiment, it is possible to perform the arithmetic convolution which is similar to that of the first embodiment.

(3) Third Situation

In the third situation where the amplitude level of the audio signal inputted is changed from low level to high level, the RAM-access control portion 502 firstly copies the address offset L to a temporary-stored variable 'LT'; and then, the RAM-access control portion 502 performs the following three steps of processing in each sampling period.

(a) First Step

The first step is provided to write the coefficient $C_1$ to $C_n$ into the coefficient RAM 501. More specifically, in accordance with the progress of the sampling periods which successively emerge after the level-detection signal LDT is cleared, the coefficients $C_1$, $C_2$, . . . are sequentially inputted from the external device (e.g., long-time reverberation storage, not shown); and then, those coefficients are written into the coefficient RAM 501 at the write addresses which are determined based on the address offset L.

(b) Second Step

The second step is provided to read out the coefficients and is carried out in parallel to the first step. The RAM-access control portion 502 produces the read address ADR, the number of which ranges from 'LT' to 'LT+n−1'. If the number of the read address ADR exceeds a number 'n−1', the number 'n−1' is subtracted from that number so as to obtain a new number for the read address ADR.

(c) Third Step

Every time one sampling period progresses, the address offset L is increased by '1'. If the address offset increased exceeds the number 'n−1', the address offset is forced to be set as follows: L=0.

If the address offset L is set at '1' before the processing in the third situation (3) is started, the relationship between the coefficients, stored in the coefficient RAM 501 at addresses 0 to n−1, and the coefficients read from the coefficient RAM 501 is changed in each sampling period because of the execution of the processing in the third situation (3). The changes in the above relationship will be described below, together with a string of sampling data used for the arithmetic convolution.

① A certain timing before the level-detection signal LDT is cleared.

| | | | | | |
|---|---|---|---|---|---|
| stored coefficients: | $C_{n+1}$, | $C_{n+2}$, | . . . , | $C_{2n-1}$, | $C_{2n}$ |
| coefficients read out: | $C_{n+1}$, | $C_{n+2}$, | . . . , | $C_{2n-1}$, | $C_{2n}$ |
| sampling data: | $X_{mb}$, | $X_{mb-1}$, | . . . , | $X_{mb-n+2}$, | $X_{mb-n+1}$ |

② First sampling period which firstly emerges after the level-detection signal LDT is cleared.

| | | | | | |
|---|---|---|---|---|---|
| stored coefficients: | $C_1$, | $C_{n+2}$, | . . . , | $C_{2n-1}$, | $C_{2n}$ |
| coefficients read out: | $C_1$, | $C_{n+2}$, | . . . , | $C_{2n-1}$, | $C_{2n}$ |
| sampling data: | $X_{mc}$, | $X_{mb}$, | . . . , | $X_{mb-n+3}$, | $X_{mb-n+2}$ |

③ Second sampling period which emerges after the first sampling period.

| | | | | | |
|---|---|---|---|---|---|
| stored coefficients: | $C_1$, | $C_2$, | . . . , | $C_{2n-1}$, | $C_{2n}$ |
| coefficients read out: | $C_1$, | $C_2$, | . . . , | $C_{n+1}$, | $C_{n+2}$ |
| sampling data: | $X_{mc+1}$, | $X_{mc}$, | . . . , | $X_{mb-n+2}$, | $X_{mb-n+1}$ |

The above processing is advantageous in that the arithmetic convolution can be performed without causing any break in sounding.

(4) Fourth Situation

In the fourth situation which emerges after all of the coefficients $C_1$ to $C_n$ are completely written into the coefficient RAM 501, the aforementioned processing in the first situation is performed under the condition where the address offset is set as follows: L=LT.

Thus, the third embodiment can impart the long-time reverberation to the audio signals without causing any break in sounding.

Lastly, this invention may be practiced or embodied in still other ways without departing from the spirit or essential character thereof as described heretofore. Therefore, the preferred embodiments described herein are illustrative and not restrictive, the scope of the invention being indicated by the appended claims and all variations which come within the meaning of the claims are intended to be embraced therein.

What is claimed is:

1. A reverberation imparting apparatus which comprises an arithmetic convolution means for performing an arithmetic convolution, using a string of coefficients, on a string of sampling data previously inputted, said reverberation imparting apparatus comprising:

level detection means for outputting a level-detection signal when an amplitude level of the sampling data inputted, to which reverberation is imparted, becomes lower than a predetermined level;

sampling-data storing means for storing a certain number of sampling data inputted;

coefficient storing means for storing the string of coefficients;

data-input control means for when the level-detection signal is not outputted, controlling the sampling-data storing means to store new sampling data, which is newly inputted in a current sampling period, and for also controlling the sampling-data storing means to output the certain number of sampling data previously stored to the arithmetic convolution means, whereas when the level-detection signal is outputted, the data-input control means controls the sampling-data storing means to output the certain number of sampling data previously stored to the arithmetic convolution means without storing the new sampling data which is inputted in the current sampling period; and coefficient processing means for when the level-detection signal is not outputted, controlling the coefficient storing means to output the string of coefficients to the arithmetic convolution portion, while when the level-detection signal is outputted, the coefficient processing means controls the coefficient storing means to output the string of coefficients, except a new coefficient, which is newly incorporated in the string of coefficients, but together with an old coefficient, which is older than the string of coefficients, to the arithmetic convolution means and store them in the coefficient storing means, whereas when a state, where the level-detection signal is outputted, is changed to a stale where the level-detection signal is not outputted, the coefficient processing means initializes the contents of the coefficient storing means by a certain set of coefficients which correspond to a period of time between a current timing and a certain previous timing.

2. A reverberation imparting apparatus which comprises arithmetic convolution means for performing an arithmetic convolution, using a string of coefficients, on a string of sampling data inputted, said reverberation imparting apparatus comprising:

level detection means for outputting a level-detection signal when an amplitude level of sampling data inputted, to which reverberation is imparted, becomes lower than a predetermined level;

sampling-data storing means for storing the string of sampling data previously inputted, the string of sampling data being divided into a former-half part and a latter-half part which are respectively and independently stored by the sampling-data storing means;

coefficient storing means for storing the string of coefficients, the string of coefficients being divided into a former-half part and a latter-half part which are respectively and independently stored by the coefficient storing means;

data-input control means for when the level-detection signal is not outputted, controlling the sampling-data storing means to store sampling data by each sampling period and to also output a certain number of sampling data previously stored to the arithmetic convolution means, whereas when the level-detection signal is outputted, the data-input control means controls the sampling-data storing means to fix the latter-half part in the string of sampling data but to output the certain number of sampling data previously stored to the arithmetic convolution means; and coefficient-change control means for when the level-detection signal is not outputted, controlling the coefficient storing means to output the string of coefficients stored to the arithmetic convolution means by each sampling period, while when the level-detection signal is outputted, the coefficient-change control means controls the coefficient storing means to output the former-half part in the string of coefficients and the latter-half part in the string of coefficients, except a new coefficient included therein, and together with a coefficient which is older than the latter-half part in the string of coefficients, to the arithmetic convolution means and to also store them in the coefficient storing means, whereas when a state, where the level-detection signal is outputted, is changed to a state where the level-detection signal is not outputted, the coefficient-change control means initializes the contents of the latter-half part in the string of coefficients stored by the coefficient storing means.

* * * * *